(12) United States Patent
Jean et al.

(10) Patent No.: US 12,635,294 B2
(45) Date of Patent: May 19, 2026

(54) LIGHT EMITTING DEVICE AND METHOD OF MANUFACTURING THE SAME

(71) Applicant: SAMSUNG ELECTRONICS CO., LTD., Suwon-si (KR)

(72) Inventors: Jaiwon Jean, Seoul (KR); Namsung Kim, Hwaseong-si (KR); Yuri Sohn, Seongnam-si (KR); Daemyung Chun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 568 days.

(21) Appl. No.: 18/114,785

(22) Filed: Feb. 27, 2023

(65) Prior Publication Data

US 2023/0275183 A1 Aug. 31, 2023

(30) Foreign Application Priority Data

Feb. 28, 2022 (KR) ........................ 10-2022-0026220

(51) Int. Cl.
*H10H 20/819* (2025.01)
*H10H 20/01* (2025.01)
*H10H 20/815* (2025.01)

(52) U.S. Cl.
CPC .... *H10H 20/819* (2025.01); *H10H 20/01335* (2025.01); *H10H 20/815* (2025.01)

(58) Field of Classification Search
CPC .. C30B 25/04; H10H 20/01335; H10H 20/82; H10H 20/815; H01L 21/02642; H01L 21/02639; H01L 21/02647; H01L 21/0254
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |

(Continued)

FOREIGN PATENT DOCUMENTS

| | | |
|---|---|---|
| KR | 10-2004-0078209 A | 9/2004 |
| KR | 10-2005-0072862 A | 7/2005 |
| KR | 10-1146819 B1 | 5/2012 |

*Primary Examiner* — Alia Sabur
(74) *Attorney, Agent, or Firm* — Sughrue Mion, PLLC

(57) ABSTRACT

A light emitting device is provided. The light emitting device includes: a first semiconductor layer; a dislocation blocking layer on an upper surface of the first semiconductor layer and having a plurality of holes formed therein; a second semiconductor layer on the dislocation blocking layer; a third semiconductor layer on the second semiconductor layer; an active layer on the third semiconductor layer; and a fourth semiconductor layer on the active layer. A plurality of voids, which respectively overlap the plurality of holes along a vertical direction perpendicular to the upper surface of the first semiconductor layer, are provided between the first semiconductor layer and the second semiconductor layer.

19 Claims, 39 Drawing Sheets

(56)                  References Cited

U.S. PATENT DOCUMENTS

| | | | |
|---|---|---|---|
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,093,686 B2 | 1/2012 | Garnier | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,642,421 B2 | 2/2014 | Tran | |
| 8,735,931 B2 | 5/2014 | Han et al. | |
| 8,766,295 B2 | 7/2014 | Kim | |
| 8,790,940 B2 | 7/2014 | Zhu et al. | |
| 2003/0203531 A1* | 10/2003 | Shchukin | C30B 25/18 |
| | | | 438/77 |
| 2004/0192016 A1* | 9/2004 | Harle | H10H 20/01335 |
| | | | 438/584 |
| 2010/0015739 A1 | 1/2010 | Park | |
| 2010/0124814 A1* | 5/2010 | Arena | H01L 21/0254 |
| | | | 257/E21.132 |
| 2010/0265976 A1 | 10/2010 | Bousquet et al. | |
| 2013/0143394 A1* | 6/2013 | Faurie | H01L 21/02658 |
| | | | 438/479 |
| 2019/0326349 A1* | 10/2019 | Kwon | H10H 20/856 |

* cited by examiner

LIGHT EMITTING DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0026220, filed on Feb. 28, 2022, in the Korean Intellectual Property Office, the disclosure of which is incorporated by reference herein in its entirety.

BACKGROUND

The present disclosure relates to a light emitting device and a method of manufacturing the light emitting device, and more specifically, to a light emitting device including voids and a method of manufacturing the light emitting device.

When a nitride-based semiconductor layer for a light emitting device is formed, mismatch in a lattice constant and a thermal expansion coefficient between a substrate and the nitride-based semiconductor layer causes an increase in dislocation and/or a crack density in the nitride-based semiconductor layer, which may cause performance degradation of the light emitting device. Therefore, it is necessary to block the dislocation and/or crack so that the dislocation or crack in the lower nitride-based semiconductor layer does not propagate to the upper nitride-based semiconductor layer, which affects the performance of the light emitting device.

SUMMARY

The present disclosure provides a light emitting device capable of improving the performance of the light emitting device by blocking structural defects, including dislocation and cracking, from propagating.

According to an aspect of an embodiment, a light emitting device includes: a first semiconductor layer; a dislocation blocking layer on an upper surface of the first semiconductor layer and having a plurality of holes formed therein; a second semiconductor layer on the dislocation blocking layer; a third semiconductor layer on the second semiconductor layer; an active layer on the third semiconductor layer; and a fourth semiconductor layer on the active layer. A plurality of voids, which respectively overlap the plurality of holes along a vertical direction perpendicular to the upper surface of the first semiconductor layer, are provided between the first semiconductor layer and the second semiconductor layer.

According to an aspect of an embodiment, a light emitting device includes: a barrier rib structure having an opening formed therein; and a light emitting structure on the barrier rib structure. The light emitting structure includes a first semiconductor layer, a dislocation blocking layer, a second semiconductor layer, a third semiconductor layer, an active layer, and a fourth semiconductor layer sequentially stacked along a vertical direction on the barrier rib structure. A plurality of recesses are formed in the first semiconductor layer. At least one void is located within at least one of the plurality of recesses.

According to an aspect of an embodiment, a light emitting device includes: a silicon barrier rib structure having an opening formed therein; and a light emitting structure on the silicon barrier rib structure. The light emitting structure includes a first semiconductor layer, a silicon nitride layer, includes a first semiconductor layer, a silicon nitride layer, a second semiconductor layer, a third semiconductor layer, an active layer, and a fourth semiconductor layer sequentially stacked on the silicon barrier rib structure. A plurality of recesses are formed in the first semiconductor layer. At least one void is located in at least one of the plurality of recesses.

According to an aspect of an example embodiment, a method of manufacturing a light emitting device includes: forming, on a substrate, a first semiconductor layer having a plurality of recesses formed therein; forming, on the first semiconductor layer, a dislocation blocking layer having a plurality of holes formed therein; forming a first portion of a second semiconductor layer by three-dimensionally growing the first semiconductor layer to define a plurality of voids between the first semiconductor layer and the second semiconductor layer in the plurality of recesses; forming a second portion of the second semiconductor layer by laterally growing the first portion of the second semiconductor layer; forming a remainder of the second semiconductor layer by growing the second portion of the second semiconductor layer; forming a third semiconductor layer on the second semiconductor layer; forming an active layer on the third semiconductor layer; and forming a fourth semiconductor layer on the active layer.

According to an aspect of an example embodiment, a method of manufacturing a light emitting device includes: forming a dislocation blocking layer having a plurality of holes on a first semiconductor layer which has a plurality of recesses formed therein; forming a first portion of a second semiconductor layer by three-dimensionally growing the first semiconductor layer to define a plurality of voids between the first semiconductor layer and the second semiconductor layer in the plurality of recesses; forming a second portion of the second semiconductor layer by laterally growing the first portion of the second semiconductor layer; forming a remainder of the second semiconductor layer by growing the second portion of the second semiconductor layer; forming a third semiconductor layer on the second semiconductor layer; forming an active layer on the third semiconductor layer; forming a fourth semiconductor layer on the active layer; and removing a portion of the first semiconductor layer. At least a portion of the plurality of voids remains after the portion of the first semiconductor layer is removed.

According to an aspect of an example embodiment, a method of manufacturing a light emitting device includes: forming a dislocation blocking layer having a plurality of holes on a first semiconductor layer which has a plurality of recesses formed therein; forming a first portion of a second semiconductor layer by three-dimensionally growing the first semiconductor layer to define a plurality of voids between the first semiconductor layer and the second semiconductor layer in the plurality of recesses; forming a second portion of the second semiconductor layer by laterally growing the first portion of the second semiconductor layer; forming a remainder of the second semiconductor layer by growing the second portion of the second semiconductor layer; forming a third semiconductor layer on the second semiconductor layer; forming an active layer on the third semiconductor layer; forming a fourth semiconductor layer on the active layer; and removing a portion of the first semiconductor layer and at least a portion of the plurality of voids.

BRIEF DESCRIPTION OF THE DRAWINGS

The above and other aspects and features will be more apparent from the following description of example embodiments taken in conjunction with the accompanying drawings in which:

FIGS. 7A, 7B, 7C, 7D, 7E, 7F, 7G, 7H, 7I, 7J, 7K, 7L and 7M are cross-sectional views illustrating a method of manufacturing a semiconductor device, according to an example embodiment;

FIG. 9 is a plan view illustrating a light source module according to an embodiment;

DETAILED DESCRIPTION

Hereinafter, embodiments are described in conjunction with the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1A:
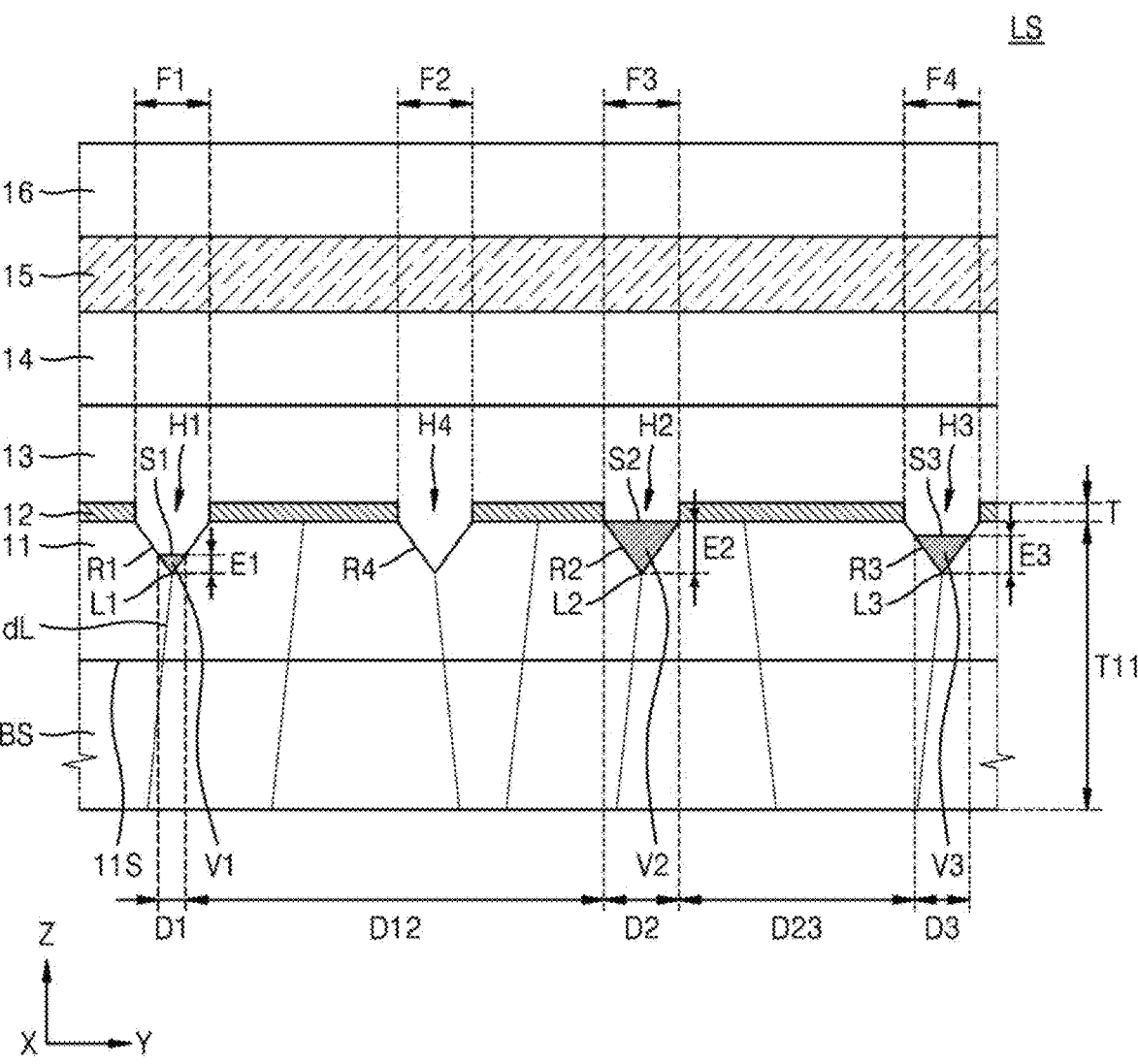
FIG. 1A is a cross-sectional view illustrating a light emitting stack according to an embodiment.

FIG. 1A is a cross-sectional view illustrating a light emitting stack LS according to an embodiment.

Referring to FIG. 1A, the light emitting stack LS may include a first semiconductor layer 11, a dislocation blocking layer 12, a second semiconductor layer 13, a plurality of voids, such as first, second, and third voids V1, V2, and V3, a third semiconductor layer 14, an active layer 15, and a fourth semiconductor layer 16. In some embodiments, the light emitting stack LS may further include a buffer structure BS under the first semiconductor layer 11.

The buffer structure BS may include a nucleation layer, a dislocation removal structure, and a buffer layer in some embodiments. The nucleation layer may be a layer for forming nuclei of crystal growth. The nucleation layer may prevent a melt-back phenomenon in which Ga contained in another layer (e.g., a dislocation removal structure or a buffer layer) in the buffer structure BS contacts and reacts with Si in a substrate for growing the buffer structure BS. The nucleation layer may also assist in wetting of the dislocation removal structure. In some embodiments, the nucleation layer may include aluminum nitride (AlN).

The dislocation removal structure may include a first material layer on the nucleation layer and a second material layer on the first material layer. The first material layer may include $B_xAl_yIn_zGa_{1-x-y-z}N$ ($0 \leq x < 1$, $0 < y < 1$, $0 \leq z < 1$, and $0 \leq x+y+z < 1$). The second material layer may have a lattice constant that is different from the lattice constant of the first material layer. In some embodiments, the second material layer may include the same material as the nucleation layer. For example, the second material layer may include AlN. A difference in lattice constant between the first material layer and the second material layer at the interface (i.e., the upper surface of the first material layer) between the first material layer and the second material layer may bend a dislocation or a crack, or reduce the dislocation by forming a half loop of dislocation.

In addition, the roughness of the upper surface of the first material layer may be greater than the roughness of the upper surface of the nucleation layer and the roughness of the upper surface of the second material layer. The relatively large roughness of the interface between the first material layer and the second material layer (i.e., the upper surface of the first material layer) may reduce dislocation and/or crack density by bending the dislocations and cracks.

In some embodiments, the lattice constant of the second material layer may be less than the lattice constant of the first material layer. Accordingly, tensile stress may form in the second material layer, which may cause structural defects, such as dislocations and cracks. In this case, by forming the thickness of the second material layer to be less than the thickness of the nucleation layer, the tensile stress may be reduced to prevent the dislocations and cracks.

The buffer layer may buffer a difference in a lattice constant and a coefficient of thermal expansion between a layer (e.g., the first semiconductor layer 11) formed on the buffer structure BS and the second material layer. For example, a lattice constant of the buffer layer may be between a lattice constant of the first semiconductor layer 11 and a lattice constant of the second material layer. In addition, a coefficient of thermal expansion of the buffer layer may be between a coefficient of thermal expansion of the first semiconductor layer 11 and a coefficient of thermal expansion of the second material layer. In some embodiments, the buffer layer may include the same material as the first material layer. In some embodiments, the buffer layer may include $B_xAl_yIn_zGa_{1-x-y-z}N$ ($0 \leq x < 1$, $0 < y < 1$, $0 \leq z < 1$, and $0 \leq x+y+z < 1$).

In some embodiments, at least one of the nucleation layer, the first material layer, the second material layer, and the buffer layer may be doped with Si. Si doping may prevent cracks by reducing tensile stress or forming compressive stress. For example, the Si doping concentration may be about 0 to about $10^{19}$ cm$^{-3}$ or less.

The first semiconductor layer 11 may be positioned on the buffer structure BS. The first semiconductor layer 11 may include $Al_xIn_yGa_{1-x-y}N$ ($0 \leq x \leq 1$, $0 \leq y \leq 1$, and $0 \leq x+y \leq 1$). The first semiconductor layer 11 may be undoped or barely doped. For example, the first semiconductor layer 11 may include GaN.

The dislocation blocking layer 12 may be disposed on the first semiconductor layer 11. The dislocation blocking layer 12 may include SiN, TiO$_2$, SiO$_2$, or a combination thereof. The dislocation blocking layer 12 may prevent a dislocation dL or crack in the first semiconductor layer 11 from propagating to the second semiconductor layer 13. The dislocation blocking layer 12 may include a plurality of holes, for example, first to fourth holes H1 to H4. In a planar view (i.e., when viewed in the Z direction), maximum dimensions F1 to F4 of the plurality of holes, for example, the first to fourth holes H1 to H4, respectively, may each be about 10 nm to about 500 nm. In a planar view (i.e., when viewed in the Z direction), the density of the plurality of holes may be about $10^3$/cm$^2$ to $10^{10}$/cm$^2$. The spacing between the plurality of holes in the dislocation blocking layer 12, for example, the first to fourth holes H1 to H4 may not be constant. The plurality of holes, for example, the first to fourth holes H1 to H4, may be at least partially filled by the second semiconductor layer 13. A thickness T of the dislocation blocking layer 12 may be about 1.5 μm to about 3.5 μm. When the thickness T of the dislocation blocking layer 12 is less than about 1.5 μm, it may cause an electrical failure, and when the thickness T of the dislocation blocking layer 12 is greater than about 3.5 μm, optical properties of the light emitting stack LS may deteriorate.

The second semiconductor layer 13 may be positioned on the first semiconductor layer 11. The second semiconductor layer 13 may include $Al_xIn_yGa_{1-x-y}N$ ($0 \leq x \leq 1$, $0 \leq y \leq 1$, and $0 \leq x+y \leq 1$). The second semiconductor layer 13 may be undoped or barely doped. For example, the second semiconductor layer 13 may include GaN.

The plurality of voids, for example, the first to third voids V1 to V3, may be located between the first semiconductor layer 11 and the second semiconductor layer 13. The plurality of voids, for example, the first to third voids V1 to V3, may respectively overlap the plurality of holes, for example, the first to third holes H1 to H3, in a planar view (i.e., along the Z direction). The plurality of voids, for example, the first to third voids V1 to V3, may block a dislocation or crack from propagating. That is, the plurality of voids, for example, the first to third voids V1 to V3, may prevent dislocations and cracks in the first semiconductor layer 11 from propagating into the second semiconductor layer 13. In some embodiments, as shown in FIG. 1A, a cross-section of each of the plurality of voids, for example, the first to third voids V1 to V3, may be an inverted triangle.

In some embodiments, a distance between the upper surface S1 of the first void V1 and a lower surface 11S of the first semiconductor layer 11 may be less than a thickness T11 of the first semiconductor layer 11. Similarly, a distance between the upper surface S3 of the third void V3 and the lower surface 11S of the first semiconductor layer 11 may be less than the thickness T11 of the first semiconductor layer 11. However, embodiments are not limited thereto and, for example, a distance between the upper surface S2 of the second void V2 and the lower surface 11S of the first semiconductor layer 11 may be equal to the thickness T11 of the first semiconductor layer 11. In some embodiments, the distance between the upper surface S2 of the second void V2 and the lower surface 11S of the first semiconductor layer 11 may be different from the distance between the upper surface S1 of the first void V1 and the lower surface 11S of the first semiconductor layer 11. That is, the upper surface S2 of the second void V2 may be at a different level from the upper surface of the first void V1 in the vertical direction (Z direction). However, a distance between a lower end of the first void V1 and the lower surface 11S of the first semiconductor layer 11 may be the same as a distance between a lower end of the second void V2 and the lower surface 11S of the first semiconductor layer 11. That is, the lower end of the first void V1 and the lower end of the second void V2 may be at the same level in the vertical direction (Z direction). In a planar view (i.e., when viewed in the Z direction), a distance between the plurality of voids, for example, the first to third voids V1 to V3, may not be constant. For example, a distance D12 between the first void V1 and the second void V2 may be different from a distance D23 between the second void V2 and the third void V3.

In some embodiments, maximum dimensions of the plurality of voids, for example, D1 to D3 respectively corresponding to the first to third voids V1 to V3, in a planar view (i.e., when viewed in the Z direction) may each be about 10 nm to about 500 nm. When the maximum dimensions when viewed in the Z direction are less than about 10 nm, the plurality of voids may not be able to block dislocations and cracks. It may be difficult to manufacture voids that are larger than about 500 nm when viewed in the Z direction.

In some embodiments, a dimension of each of the plurality of voids, for example, E1 to E3 respectively corresponding to the first to third voids V1 to V3, in the vertical direction (Z direction), may be about 10 nm to about 500 nm. When the dimension in the vertical direction (Z direction) is less than about 10 nm, the plurality of voids may not be able to block dislocations and cracks. It may be difficult to manufacture large voids having the dimension in the vertical direction (Z direction) that is greater than about 500 nm.

In some embodiments, the density of the plurality of voids may be from about $10^3$/cm$^2$ to about $10^{10}$/cm$^2$ in a planar view (i.e., when viewed in the Z direction). When the density of the plurality of voids is less than about $10^3$/cm$^2$ in a plan view (i.e., when viewed in the Z direction), the plurality of voids may not be able to sufficiently block dislocation and crack propagation. When the density of the plurality of voids is greater than about $10^{10}$/cm$^2$, optical properties of the light emitting stack LS may deteriorate. In some embodiments, a density of the plurality of voids may be less than a density of the plurality of holes. Some holes, such as the fourth hole H4 of the dislocation blocking layer 12, may not have a void that overlaps the hole. Therefore, the number of voids may be less than the number of holes.

The first semiconductor layer 11 may include a plurality of recesses in the first semiconductor layer 11 from the upper surface of the first semiconductor layer 11, for example, first to fourth recesses R1 to R4. A cross-section of each of the plurality of recesses, for example, the first to fourth recesses R1 to R4, may be an inverted triangle. A plurality of recesses, for example, the first to fourth recesses R1 to R4, may respectively overlap with the plurality of holes of the dislocation blocking layer 12, for example, the first to fourth holes H1 to H4 in a planar view (i.e., when viewed in the Z direction). The second semiconductor layer 13 may extend through the plurality of holes and partially fill the plurality of recesses. For example, the second semiconductor layer 13 may partially fill the first recess R1, and the first void V1 may be located in the remaining portion of the first recess R1, for example, a lower portion of the first recess R1. The second semiconductor layer 13 may partially fill the second recess R2, and the second void V2 may be positioned in the second recess R2. The second semiconductor layer 13 may partially fill the third recess R3, and the third void V3 may be positioned in the remaining portion of the third recess R3, for example, a lower portion of the third recess R3. The second semiconductor layer 13 may entirely fill the fourth recess R4. Therefore, the void may not be located in the fourth recess R4.

The third semiconductor layer 14 may be located on the second semiconductor layer 13, the active layer 15 may be located on the third semiconductor layer 14, and the fourth semiconductor layer 16 may be located on the active layer 15. The third semiconductor layer 14 and the fourth semiconductor layer 16 may include $Al_xIn_yGa_{1-x-y}N$ ($0 \le x \le 1$, $0 \le y \le 1$, and $0 \le x+y \le 1$). The third semiconductor layer 14 and the fourth semiconductor layer 16 may be doped with n-type and p-type impurities, respectively. In other embodiments, the third semiconductor layer 14 and the fourth semiconductor layer 16 may be doped with p-type and n-type impurities, respectively. The n-type impurity may include, for example, Si, Ge, Se, Te, or a combination thereof. The p-type impurity may include, for example, Mg, Zn, Be, Cd, Ba, Ca, or a combination thereof. For example, the third semiconductor layer 14 may include n-type doped GaN, and the fourth semiconductor layer 16 may include p-type doped GaN.

The active layer 15 may emit light by recombination of electrons and holes. In some embodiments, the active layer 15 may be a layer made of a single material, such as InGaN. In other embodiments, the active layer 15 may have a single quantum well (SQW) or multi quantum well (MQW) structure in which quantum barrier layers and quantum well layers are alternately stacked with each other. For example, the active layer 15 may have a quantum well structure including a GaN/InGaN combination, an AlGaN/InGaN combination, or an InAlGaN/InGaN combination.

Figure 4A:
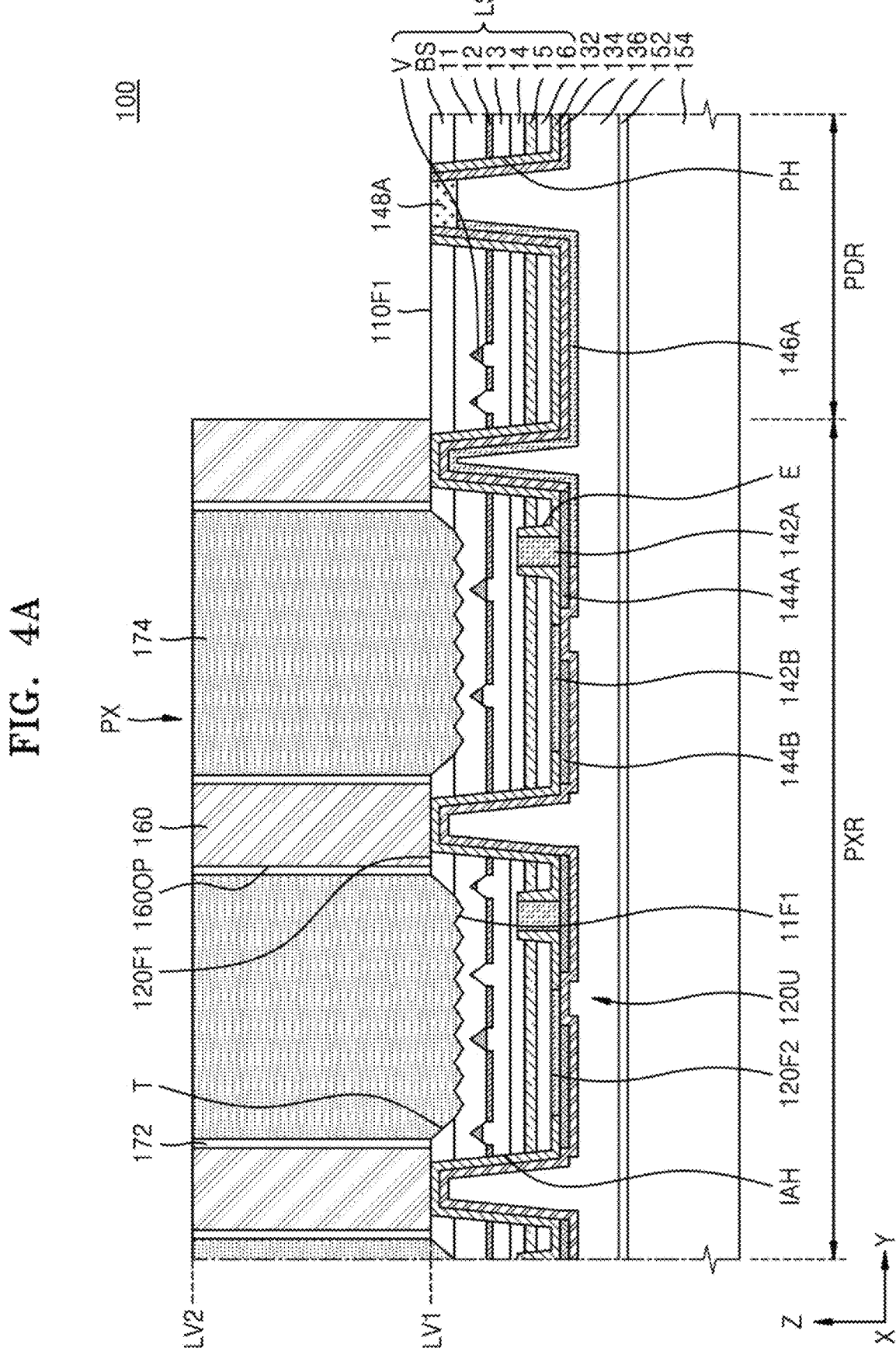
FIG. 4A is a cross-sectional view taken along line A1-A1' of FIG. 3.

The light emitting stack LS may be formed on a substrate. The substrate may be removed after the light emitting stack LS is formed. In other embodiments, the substrate may be included in the light emitting device by not being removed. In other embodiments, as shown in FIG. 4A, a portion of the substrate may be removed and another portion of the substrate may remain in the light emitting device 100 as a barrier rib structure 160. The buffer structure BS may be removed after the light emitting stack LS is formed in some embodiments. In other embodiments, a portion of the buffer structure BS may be removed and the other portion of the buffer structure BS may remain in the light emitting stack LS.

Figure 1B:
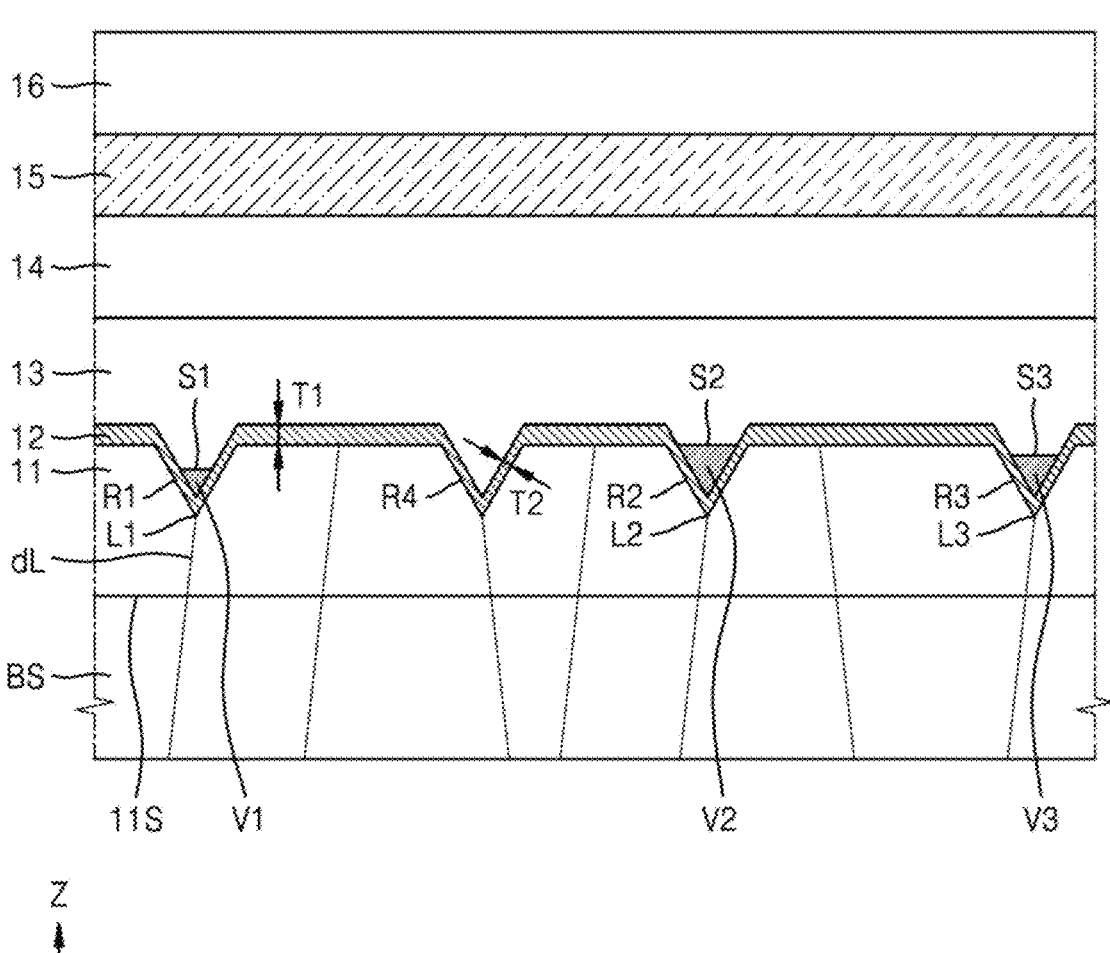
FIG. 1B is a cross-sectional view illustrating a light emitting stack according to an embodiment.

FIG. 1B is a cross-sectional view illustrating a light emitting stack LS-1 according to an embodiment.

Referring to FIG. 1B, the dislocation blocking layer 12 may further extend on inner sides of the plurality of recesses R1 to R4. The plurality of voids V1 to V3 may be positioned between the dislocation blocking layer 12 and the second semiconductor layer 13. In some embodiments, the thickness T2 of the portion of the dislocation blocking layer 12 on inner sides of the plurality of recesses R1 to R4 may be less than the thickness T1 of a portion of the dislocation blocking layer 12 on the upper surface of the first semiconductor layer 11.

Figure 2:
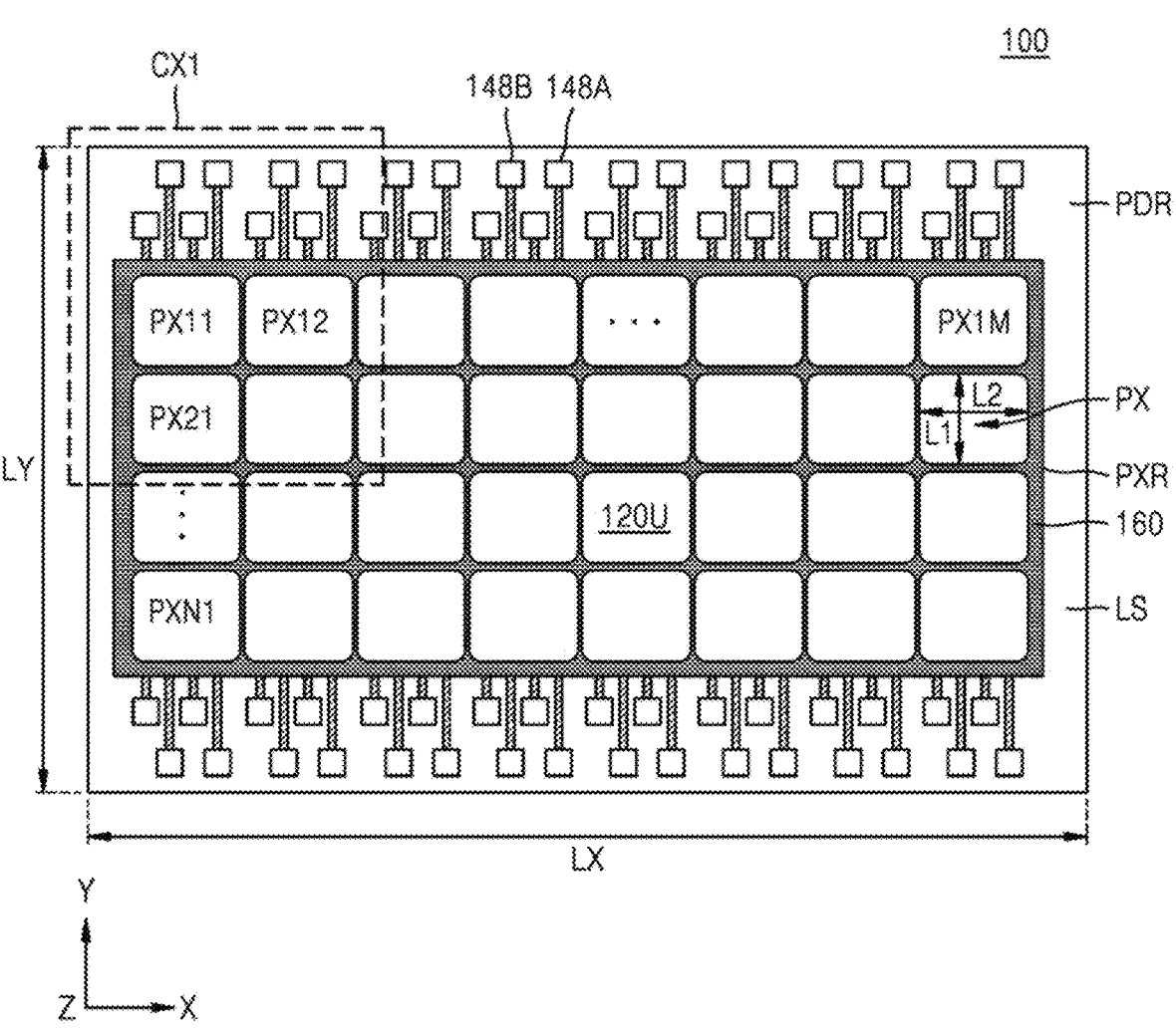
FIG. 2 is a plan view illustrating a light emitting device according to an embodiment.
Figure 3:
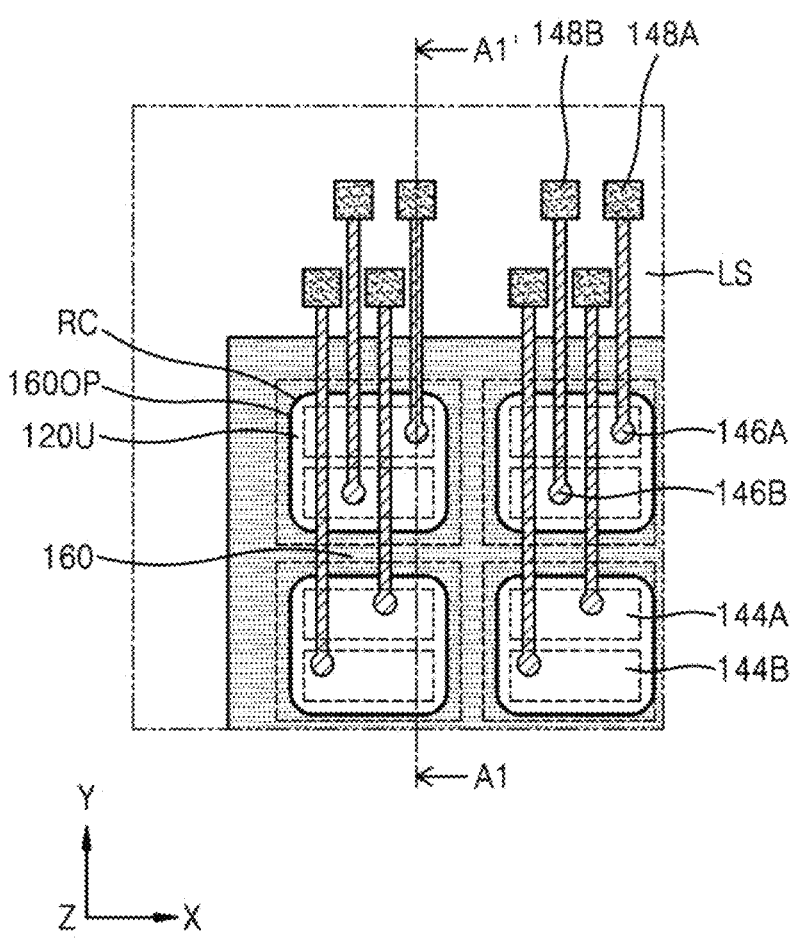
FIG. 3 is an enlarged view of a region CX1 of FIG. 2.

FIG. 2 is a plan view illustrating a light emitting device 100 according to an embodiment. FIG. 3 is an enlarged view of a region CX1 of FIG. 2. FIG. 4A is a cross-sectional view taken along line A1-A1' of FIG. 3.

Referring to FIGS. 2, 3, and 4A, the light emitting device 100 may include a pixel region PXR and a pad region PDR surrounding the pixel region PXR. In the pixel region PXR, M pixels PX11, PX12, . . . , PX1M may be arranged along the X axis, and N pixels PX11, PX21, . . . , PXN1 may be arranged along the Y axis. As shown in FIG. 2, a total of 32 pixels PXs including 8 pixels PXs along the X axis and 4 pixels PXs along the Y axis may be arranged in an array, but the number of pixels PXs arranged along the X axis, the number of pixels PXs arranged along the Y axis, and the total number of pixels PXs may be changed. Although each pixel PX is illustrated as having the same size in FIG. 2, in some embodiments, all pixels PXs do not have to have the same size. For example, in some pixels PXs, the Y-direction length L2 of the pixel PX may be greater than the X-direction length L1 of the pixel PX, and in the remaining pixels PXs, the X-direction length L1 of the pixel PX may be the same as the Y-direction length L2 of the pixel PX. For example, in some pixels PXs, a ratio of the Y-direction length L2 to the X-direction length L1 of the pixel PX may be about 1.5:1 to about 4.5:1.

As shown in FIG. 2, the light emitting device 100 may have a substantially rectangular shape in a planar view (i.e., when viewed in the Z direction). The length of the first side of the rectangle, that is, the width LX in the X direction of the light emitting device 100 may be greater than the length of the second side of the rectangle, that is, the width LY in the Y direction of the light emitting device 100. According to example embodiments, the X-direction width LX of the light emitting device 100 may be equal to about 1.1 times the Y-direction width LY or greater than about 1.1 times the Y-direction width LY of the light emitting device 100. According to example embodiments, the X-direction length LX of the light emitting device 100 may be equal to about 100 times the Y-direction length LY or less than about 100 times the Y-direction length LY of the light emitting device 100. According to example embodiments, a thickness (i.e., a length in the Z direction) of the light emitting device 100 may be several tens to several hundreds of μm. According to example embodiments, the thickness of the light emitting device 100 may be less than or equal to about ¹⁄₁₀ of the width LX of the light emitting device 100 in the X direction. The light emitting device 100 having the above-described dimensions may have dimensions in which resistance to physical stress is optimized and warpage of the light emitting device 100 is minimized.

A plurality of light emitting structures 120U may be respectively disposed on the plurality of pixels PXs to form an array of light emitting structures 120U. A barrier rib structure 160 may be disposed between the light emitting structures 120U and may surround each of the light emitting structures 120U. In the pad region PDR, the light emitting stack LS may surround the plurality of light emitting structures 120U.

The plurality of light emitting structures 120U may be separated from each other by an isolation opening IAH. In an example process, a plurality of light emitting structures 120U in the pixel region PXR may be formed from the light emitting stack LS by removing a portion of the light emitting stack LS to form the isolation opening IAH. In addition, a portion of the light emitting stack LS may remain in the pad region PDR and surround the periphery of the pixel region PXR in a plan view. The light emitting stack LS may be the light emitting stack LS described with reference to FIG. 1A or 1B. As shown in FIG. 4A, for example, the light emitting stack LS may include a buffer structure BS, a first semiconductor layer 11, a dislocation blocking layer 12, a second semiconductor layer 13, a third semiconductor layer 14, an active layer 15, a fourth semiconductor layer 16, and a plurality of voids V. In FIG. 4A, the upper surface of the buffer structure BS of the light emitting structure 120U may be referred to as a first surface 120F1 of the light emitting structure 120U, and the lower surface of the fourth semiconductor layer 16 of the light emitting structure 120U may be referred to as a second surface 120F2 of the light emitting structure 120U.

A first electrode 142A, a second electrode 142B, a first insulating layer 132, a first connection electrode 144A, and a second connection electrode 144B may be further disposed on the light emitting structure 120U. The first electrode 142A may be positioned in an electrode opening E penetrating through the active layer 15 and the fourth semiconductor layer 16 and may contact the third semiconductor layer 14. The second electrode 142B may be positioned on the lower surface of the fourth semiconductor layer 16 (i.e., the second surface 120F2 of the light emitting structure 120U). The first electrode 142A and the second electrode 142B may each include a metal material having high reflectivity. For example, the first electrode 142A and the second electrode 142B may each include Ag, Al, Ni, Cr, Cu, Au, Ti, Pt, Pd, Sn, W, Rh, Ir, Ru, Mg, Zn, or a combination thereof.

The first insulating layer 132 may cover the inner wall of the electrode opening E and may electrically insulate the first electrode 142A from the active layer 15 and the fourth semiconductor layer 16. The first insulating layer 132 may also be further positioned between the first electrode 142A and the second electrode 142B on the lower surface of the fourth semiconductor layer 16 (that is, the second surface 120F2 of the light emitting structure 120U), and may electrically insulate the first electrode 142A from the second electrode 142B. In some embodiments, the first insulating layer 132 may further extend on the side surface of the light emitting structure 120U and the lower surface of the barrier rib structure 160. In some embodiments, the upper surface of the first insulating layer 132 may be at the same vertical level LV1 as that of the first surface 120F1 of the light emitting structure 120U. The first insulating layer 132 may include an insulating material including silicon oxide, silicon nitride, or a combination thereof.

The first connection electrode 144A may be disposed on the first electrode 142A and the first insulating layer 132, and the second connection electrode 144B may be disposed on the second electrode 142B and the first insulating layer 132. The first connection electrode 144A and the second connection electrode 144B may each include Ag, Al, Ni, Cr, Cu, Au, Ti, Pt, Pd, Sn, W, Rh, Ir, Ru, Mg, Zn, or a combination thereof.

The second insulating layer 134 may be disposed on the first insulating layer 132. In addition, the second insulating layer 134 may conformally cover the first connection electrode 144A and the second connection electrode 144B. The second insulating layer 134 may include silicon oxide, silicon nitride, or a combination thereof.

A pad opening PH passing through the light emitting stack LS may be disposed in the pad region PDR. A first pad 148A may be disposed in the pad opening PH. In some embodiments, the upper surface of the first pad 148A may be disposed on the same plane as the first surface 120F1 of the light emitting structure 120U. The first pad 148A and the second pad 148B may each include Ag, Al, Ni, Cr, Cu, Au, Ti, Pt, Pd, Sn, W, Rh, Ir, Ru, Mg, Zn, or a combination thereof. A connection member, such as a bonding wire for electrical connection with a driving semiconductor chip, may be disposed on the first pad 148A and the second pad 148B. Although the first pad 148A and the second pad 148B are shown to be square in the plan view of FIG. 3, the shapes of the first pad 148A and the second pad 148B are not limited thereto. For example, the length in the Y direction of each of the first pad 148A and the second pad 148B may be greater than the length in the X direction of each of the first pad 148A and the second pad 148B. For example, each of the first pad 148A and the second pad 148B may include a first portion to which a wire for connection to a driving chip is attached and a second portion to which a probe for measuring electrical characteristics is in contact, and the first portion and the second portion may have different shapes. For example, the width of the first portion may be less than or greater than the width of the second portion.

A first wiring pattern 146A may connect the first connection electrode 144A to the first pad 148A. The first wiring pattern 146A may be disposed on the second insulating layer 134 and may be in contact with the first connection electrode 144A. A second wiring pattern 146B may connect the second connection electrode 144B to the second pad 148B. Also, the second wiring pattern 146B may be disposed on the second insulating layer 134 and may be in contact with the second connection electrode 144B. In some embodiments, the first connection electrode 144A and the second connection electrode 144B may be omitted, and the first wiring pattern 146A and the second wiring pattern 146B may directly contact the first electrode 142A and the second electrode 142B, respectively.

In some embodiments, a third wiring pattern connecting between adjacent light emitting structures 120U may be further disposed. The third wiring pattern may connect the second electrode 142B (or the second connection electrode 144B) of one light emitting structure 120U to the first electrode 142A (or the first connection electrode 144A) of the neighboring light emitting structure 120U, may connect the first electrode 142A (or the first connection electrode 144A) of one light emitting structure 120U to the first electrode 142A (or the first connection electrode 144A) of the neighboring light emitting structure 120U, or may connect the second electrode 142B (or the second connection electrode 144B) of one light emitting structure 120U to the second electrode 142B (or the second connection electrode 144B) of the neighboring light emitting structure 120U. The third wiring pattern may be disposed on the second insulating layer 134. In some embodiments, a third insulating layer may be further disposed on the first wiring pattern 146A, and the third wiring pattern may be disposed on the third insulating layer.

A buried insulating layer 136 may be disposed on the second insulating layer 134, the first wiring pattern 146A, and the second wiring pattern 146B. The buried insulating layer 136 may fill the isolation opening IAH between the light emitting structures 120U and may have a flat lower surface. A first insulating layer 132 and a second insulating layer 134 may be respectively disposed between the buried insulating layer 136 and the barrier rib structure 160 and between the buried insulating layer 136 and the light emitting structure 120U. The buried insulating layer 136 may include silicone resin, epoxy resin, or acrylic resin.

A support substrate 154 may be further disposed on the lower surface of the buried insulating layer 136. In some embodiments, the support substrate 154 may have a high electrical resistance, which may prevent an electrical connection between a circuit board under the support substrate 154 and the light emitting structure 120U. For example, the support substrate 154 may include a Si substrate and an insulating layer formed on at least one of the upper surface and the lower surface of the Si substrate. Alternatively or additionally, the support substrate 154 may be an undoped or lightly doped Si substrate having a high electrical resistance. The lower surface of the buried insulating layer 136 may be attached to the support substrate 154 through an adhesive layer 152. The adhesive layer 152 may include, for example, an insulating material, such as silicon oxide, silicon nitride, a polymer material, or resin. In some embodiments, the adhesive layer 152 and the buried insulating layer 136 may be formed of the same material, and the boundary between the adhesive layer 152 and the buried insulating layer 136 may not be discernable with the naked eye. In other embodiments, the adhesive layer 152 may include a eutectic adhesive material, such as AuSn or NiSi.

The support substrate 154 may include an insulating substrate or a conductive substrate. In example embodiments, the support substrate 154 may have an electrical resistance of at least several MΩ, for example, an electrical resistance of at least 50 MΩ. As the electrical resistance of the support substrate 154 increases, the electrical insulation of the support substrate 154 may improve. For example, the support substrate 154 may include doped silicon, undoped sapphire substrate, glass substrate, transparent conductive substrate, silicon substrate, silicon carbide substrate, $Al_2O_3$, tungsten (W), copper (Cu), bismaleimide triazine (BT) resin, epoxy resin, polyimide, liquid crystal polymer, copper clad laminate, or a combination thereof.

In example embodiments, the support substrate 154 may have a thickness of at least 150 μm in the vertical direction (Z direction), and may be within a range of, for example, about 200 μm to about 400 μm. When the thickness of the support substrate 154 is too small, for example, less than 150 μm, the support substrate may warp and the light emitting characteristics of the light emitting device 100 may be adversely affected. When the thickness of the support substrate 154 is too large, for example, greater than 400 μm, stress induced by the support substrate 154 may cause deformation of components in the vicinity of the support substrate.

The barrier rib structure 160 may be disposed on the first surface 120F1 of the plurality of light emitting structures 120U. For intelligent lighting systems, such as vehicle headlamps, the plurality of pixels PXs in the semiconductor light emitting device 100 may be individually controlled to implement various lighting modes depending on surrounding conditions. In this case, the barrier rib structure 160 may prevent light emitted from one pixel PX from penetrating an adjacent pixel PX, and thus, the contrast characteristic of the light emitting device 100 may improve.

The barrier rib structure 160 may be positioned on the buried insulating layer 136. In some embodiments, a first insulating layer 132 and/or a second insulating layer 134 may further extend between the barrier rib structure 160 and the buried insulating layer 136. The barrier rib structure 160 may include, for example, a Si substrate, a SiC substrate, a sapphire substrate, or a GaN substrate. In an example process, for example, the barrier rib structure 160 may be formed by forming a plurality of light emitting structures 120U on a substrate and then forming a plurality of openings 160OP in the substrate. In this case, the barrier rib structure 160 may be a part of a substrate for forming the light emitting stack LS.

The barrier rib structure 160 may include the plurality of openings 160OP. In some embodiments, in a planar view (i.e., when viewed in the Z direction), the opening 160OP of the barrier rib structure 160 may have round corners RC (refer to FIG. 3) to prevent cracks from occurring and propagating. In addition, in a planar view (i.e., when viewed in the Z direction), the barrier rib structure 160 may overlap a peripheral portion of the light emitting structure 120U.

In some embodiments, the buffer structure BS may be located below the barrier rib structure 160. The light emitting structure 120U may include a trench T penetrating the buffer structure BS and exposing the first semiconductor layer 11. The trench T may overlap the opening 160OP of the barrier rib structure 160. In some embodiments, in order to improve light extraction, a first surface 11F1 of the first semiconductor layer 11 exposed by the trench T may be relatively rough. The trench T may not reach the void V in the light emitting stack LS.

In some embodiments, a reflective layer 172 may be further disposed on a side surface of the barrier rib structure 160. The reflective layer 172 may reflect light emitted from the light emitting structure 120U. The reflective layer 172 may include a metal including, for example, Ag, Al, Ni, Cr, Au, Pt, Pd, Sn, W, Rh, Ir, Ru, Mg, Zn, or combinations thereof. In other embodiments, the reflective layer 172 may include, for example, resin, such as polyphthalamide (PPA) containing titanium oxide or aluminum oxide metal oxide. In other embodiments, the reflective layer 172 may be a distributed Bragg reflector layer. For example, the distributed Bragg reflective layer may have a structure in which a plurality of insulating layers having different refractive indices are repeatedly stacked several to hundreds of times. The insulating layer included in the distributed Bragg reflective layer may include, for example, oxides, such as $SiO_2$, SiN, $SiO_xN_y$, $TiO_2$, $Si_3N_4$, $Al_2O_3$, TiN, AlN, $ZrO_2$, TiAlN, TiSiN, nitrides, and combinations thereof.

A fluorescent layer 174 may be disposed in the opening 160OP of the barrier rib structure 160 and the trench T of the light emitting structure 120. The barrier rib structure 160 may contact the reflective layer 172. In other embodiments, the reflective layer 172 may not be present on the side of the barrier rib structure 160, and in this case, the side surface of the barrier rib structure 160 may be in direct contact with the fluorescent layer 174. The fluorescent layer 174 may completely or almost entirely fill the opening 160OP of the barrier rib structure 160 and the trench T of the light emitting structure 120. The level of the upper surface of the fluorescent layer 174 may be the same as the level LV2 of the upper surface of the barrier rib structure 160. The fluorescent layer 174 may have a substantially planar upper surface. The fluorescent layer 174 may be firmly fixed in each opening 160OP and each trench T by the barrier rib structure 160.

The fluorescent layer 174 may be a material which converts light emitted from the light emitting structure 120U into a desired color. The fluorescent layer 174 may include resin in which the phosphor is dispersed or a film containing the phosphor. For example, the fluorescent layer 174 may include a phosphor film in which phosphor particles are uniformly dispersed at a predetermined concentration. The phosphor particles may be a wavelength conversion material that converts the wavelength of light emitted from the plurality of light emitting structures 120U. In order to improve the density and color uniformity of the phosphor particles, the fluorescent layer 174 may include two or more kinds of phosphor particles having different size distributions.

In example embodiments, the phosphor may have various compositions and colors, such as oxide-based, silicate-based, nitride-based, and fluorite-based phosphors. For example, as the phosphor, $\beta$-SiAlON:Eu$^{2+}$ (green), (Ca, Sr)AlSiN3:Eu$^{2+}$ (red), La$_3$Si$_6$N$_{11}$:Ce$^{3+}$ (yellow), K$_2$SiF$_6$: Mn$^{4+}$ (red), SrLiAl$_3$N$_4$:Eu (red), Ln$_{4-x}$ (Eu$_z$M$_{1-z}$) xSi$_{12-y}$AlyO$_{3+x+y}$N$_{18-x-y}$ (0.5≤x≤3, 0<z<0.3, 0<y≤4) (red), K$_2$TiF$_6$:Mn$^{4+}$ (red), NaYF$_4$:Mn$^{4+}$ (red), NaGdF$_4$:Mn$^{4+}$ (red), and the like may be used. However, the type of the phosphor is not limited to the above-mentioned ones.

In other embodiments, a wavelength converting material, such as quantum dots, may be further disposed on the fluorescent layer 174. The quantum dots may have a core-shell structure using a III-V or II-VI compound semiconductor, and may have a core, such as CdSe or InP, and a shell, such as ZnS or ZnSe. In addition, the quantum dots may include a ligand for stabilizing the core and the shell.

According to the embodiments, the dislocation blocking layer 12 and the plurality of voids V may block dislocations and cracks in the first semiconductor layer 11 from propagating, thereby reducing dislocation and crack densities in the second semiconductor layer 13, the third semiconductor layer 14, the active layer 15, and the fourth semiconductor layer 16. Accordingly, the performance of the light emitting device 100 may improve.

Figure 4B:
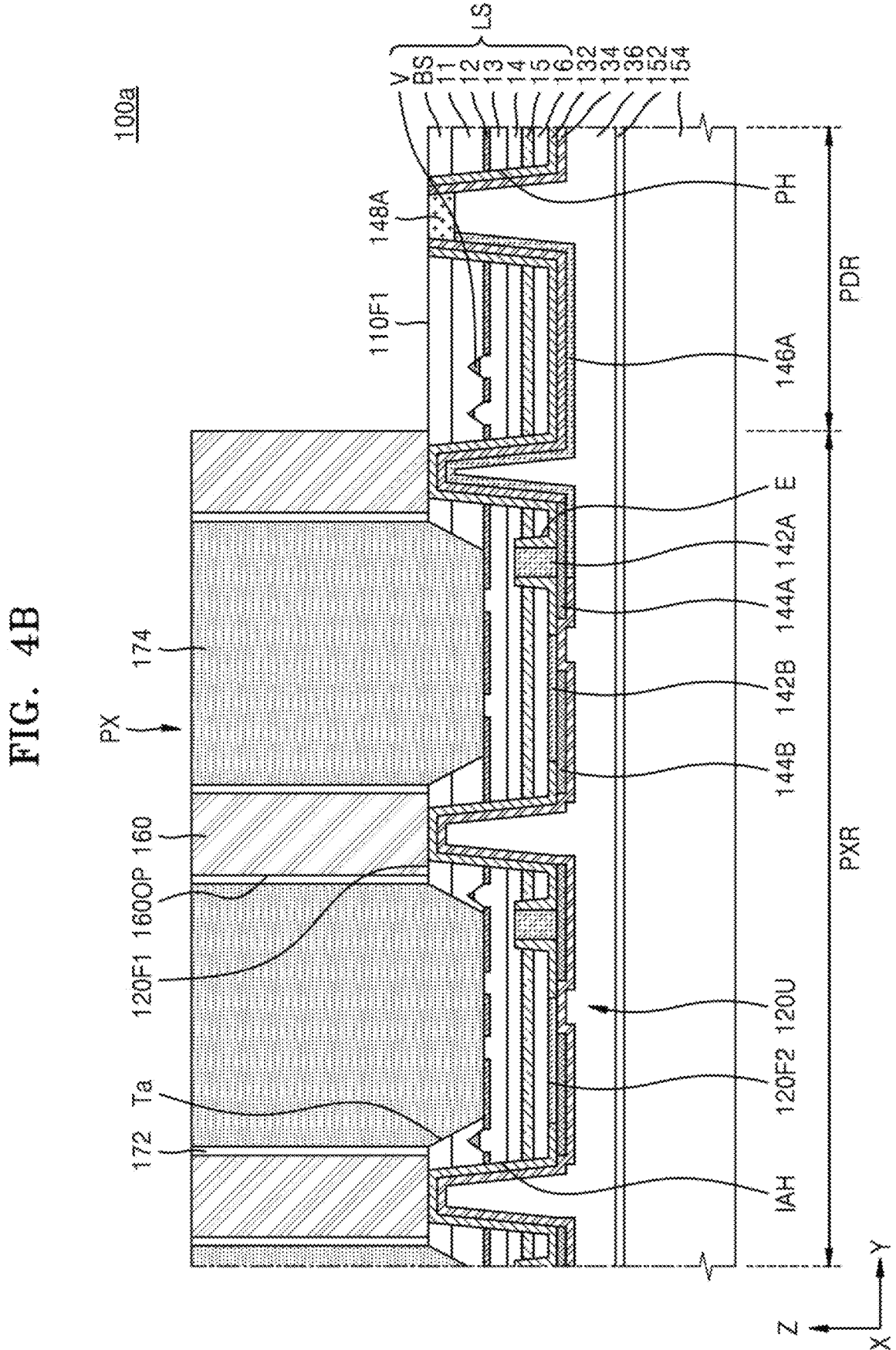
FIG. 4B is a cross-sectional view illustrating a light emitting device according to an embodiment.

FIG. 4B is a cross-sectional view illustrating a light emitting device 100a according to an embodiment. Hereinafter, differences between the light emitting device 100 shown in FIG. 4A and the light emitting device 100a shown in FIG. 4B are described.

Referring to FIG. 4B, a trench Ta of the light emitting structure 120U may penetrate the buffer structure BS and the first semiconductor layer 11 to expose the dislocation blocking layer 12 and the second semiconductor layer 13. In the process of forming the trench Ta of the light emitting structure 120U, at least one of the plurality of voids V may be removed.

Figure 4C:
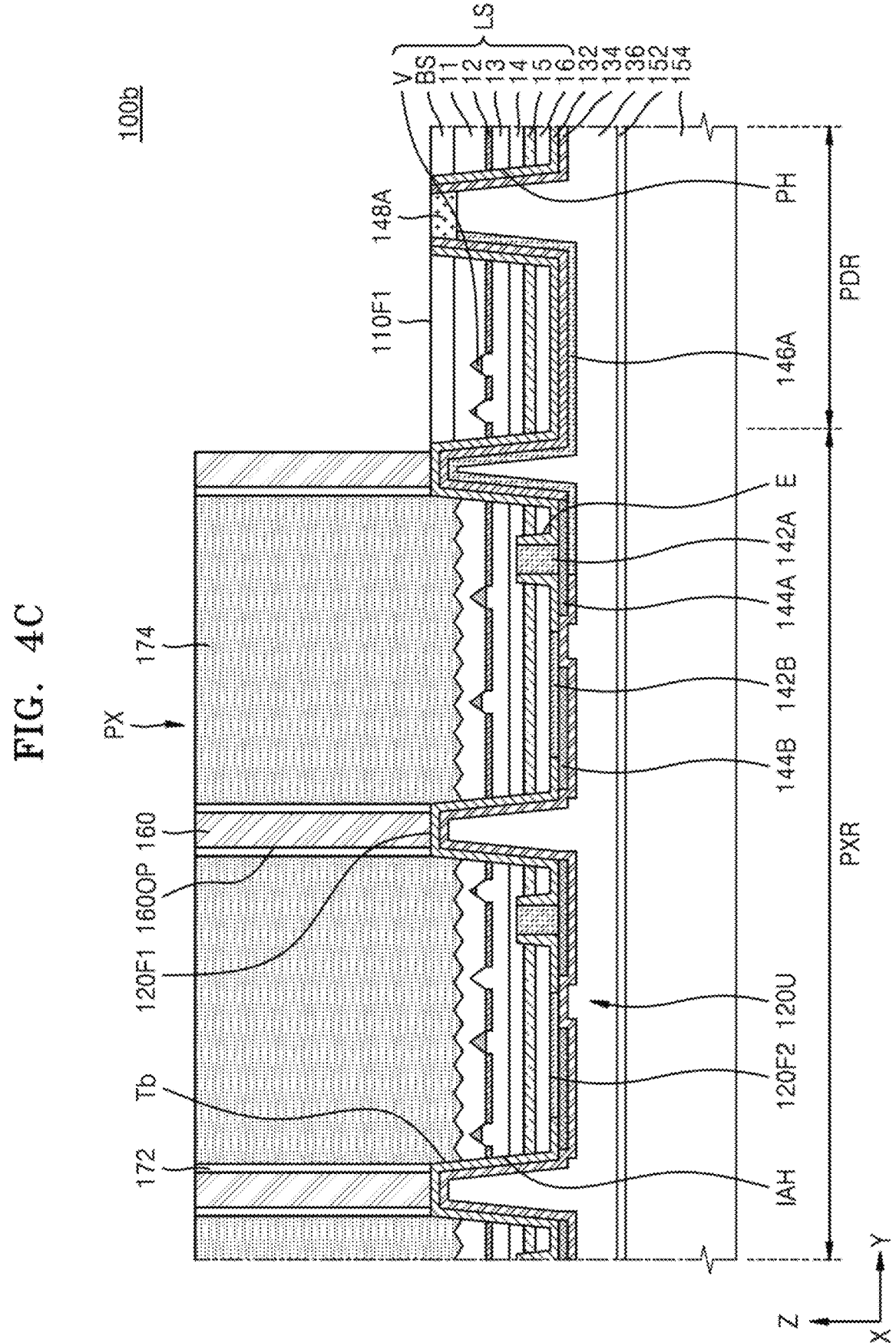
FIG. 4C is a cross-sectional view illustrating a light emitting device according to an embodiment.

FIG. 4C is a cross-sectional view illustrating a light emitting device 100b according to an embodiment. Hereinafter, differences between the light emitting device 100 shown in FIG. 4A and the light emitting device 100b shown in FIG. 4C are described.

Referring to FIG. 4C, in the process of forming a trench Tb of the light emitting structure 120U, a portion of the buffer structure BS constituting the light emitting structure 120U may be removed. Accordingly, a portion of the buffer structure BS may not remain under the barrier rib structure 160.

FIGS. 5A, 5B, 5C, 5D and 5E are cross-sectional views illustrating a method of manufacturing a light emitting stack, according to an embodiment. FIG. 6A is a scanning electron microscopy (SEM) image after the operation of FIG. 5B in a planar view. FIG. 6B is an SEM image after the operation of FIG. 5C in a planar view. FIG. 6C is an SEM image after the operation of FIG. 5D in a planar view. FIG. 6D is an SEM image of a light emitting stack manufactured according to an embodiment in a planar view.

Figure 5A:
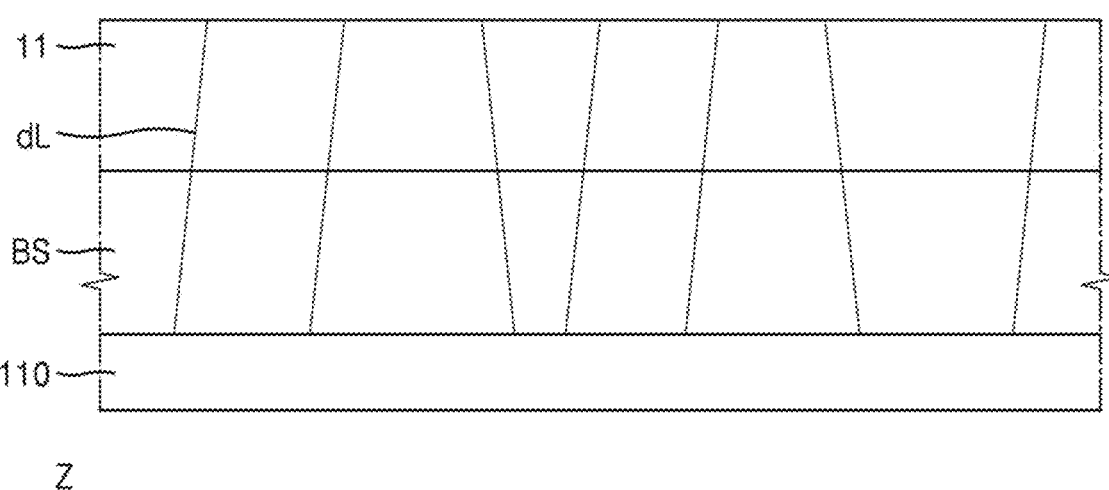
FIGS. 5A, 5B, 5C, 5D and 5E are cross-sectional views illustrating a method of manufacturing a light emitting stack, according to an embodiment.
Figure 5A:
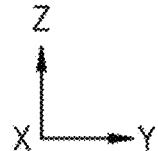
Figure 6A:
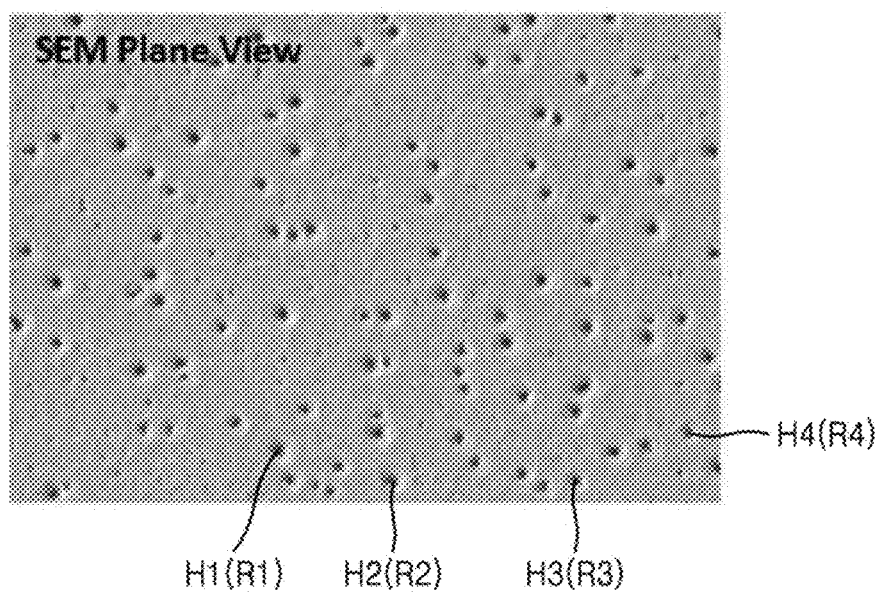
FIG. 6A is a scanning electron microscopy (SEM) image after the operation of FIG. 5B in a planar view.
Figure 6B:
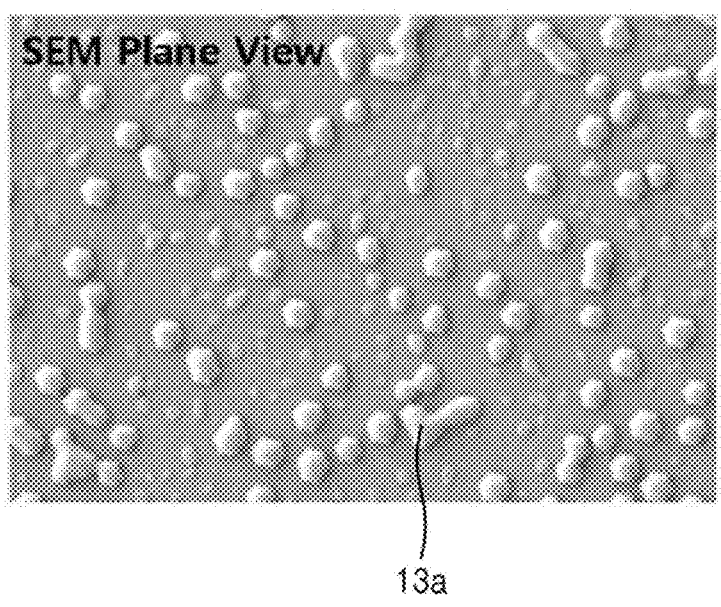
FIG. 6B is an SEM image after the operation of FIG. 5c in a planar view.
Figure 6C:
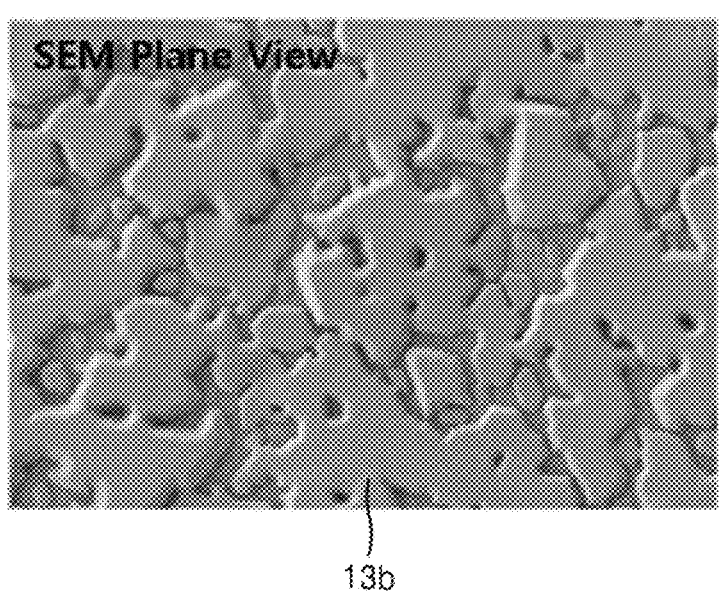
FIG. 6C is an SEM image after the operation of FIG. 5D in a planar view.
Figure 6D:
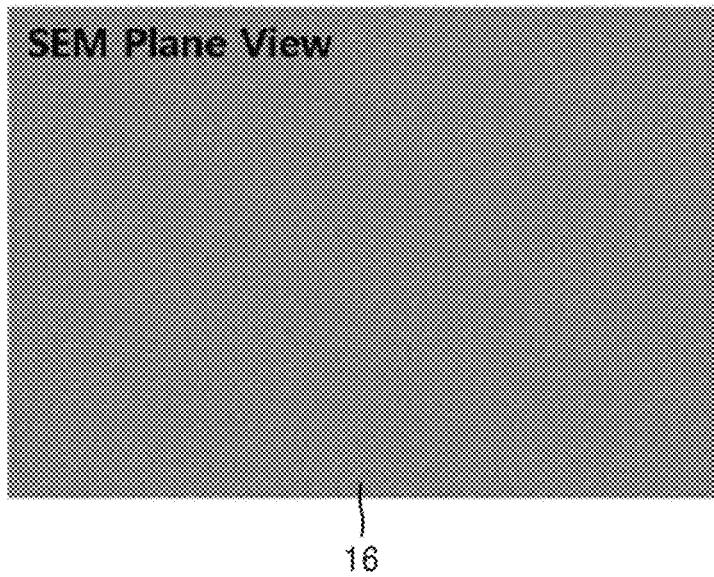
FIG. 6D is an SEM image of a light emitting stack manufactured according to an embodiment in a planar view.

Referring to FIG. 5A, the light emitting stack may be formed by, for example, metal-organic chemical vapor deposition (MOCVD), molecular beam epitaxy (MBE), or hydride vapor phase epitaxy (HVPE).

First, a buffer structure BS may be formed on a substrate 110. A first semiconductor layer 11 may be formed on the buffer structure BS. A defect, such as a dislocation dL and/or a crack, due to a difference in a thermal expansion coefficient and a lattice constant may be formed in the buffer structure BS and the first semiconductor layer 11.

Figure 5B:
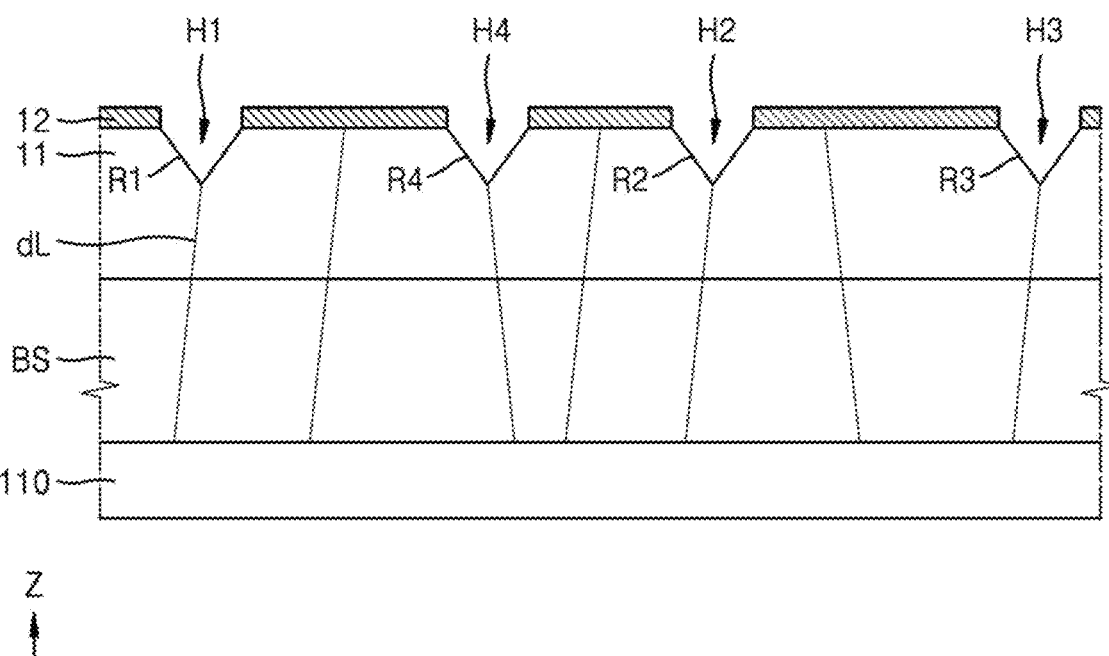

Referring to FIGS. 5B and 6A, a dislocation blocking layer 12 having a plurality of holes on the first semiconductor layer 11, such as first to fourth holes H1 to H4, and a plurality of recesses in the first semiconductor layer 11, such as the first to fourth recesses R1 to R4, may be simultaneously formed. That is, the deposition of the dislocation blocking layer 12 and the etching of the first semiconductor layer 11 may occur simultaneously.

Figure 5C:
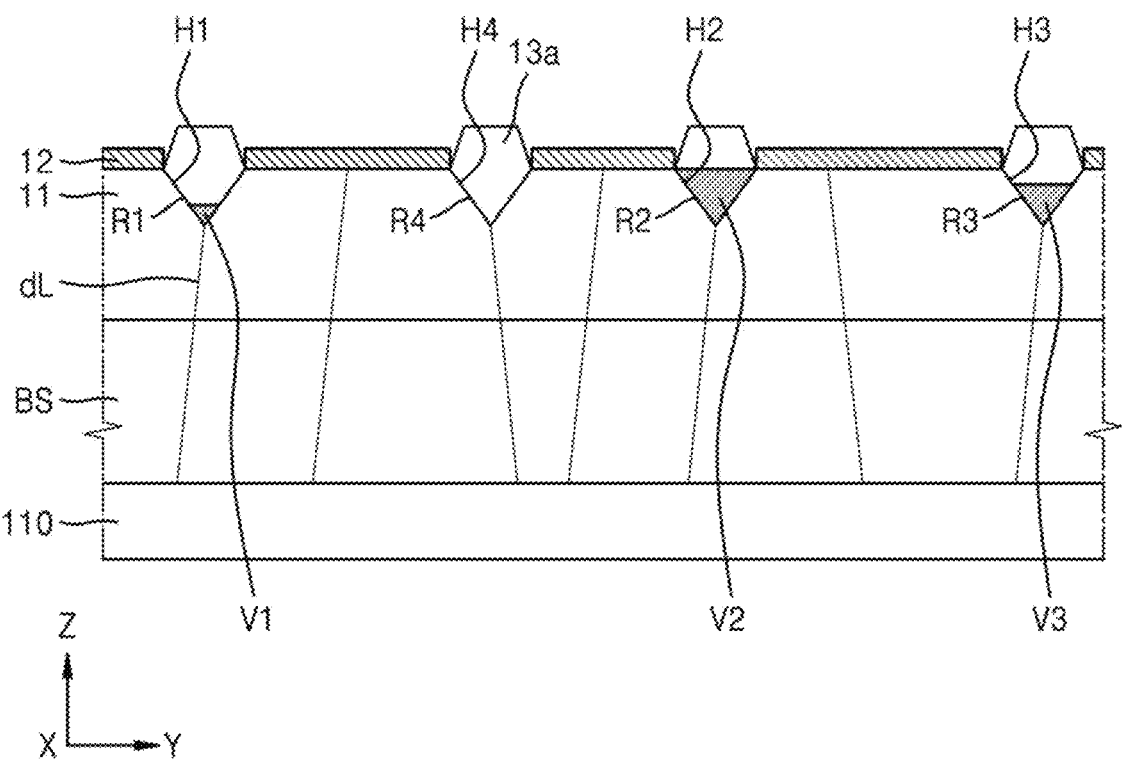

Referring to FIGS. 5C and 6B, a first portion 13a of the second semiconductor layer 13 may be formed by three-dimensionally growing the first semiconductor layer 11 so that a plurality of voids, for example, first to third voids V1 to V3, are respectively formed in the plurality of recesses, for example, the first to third recesses R1 to R3. The first portion 13a of the second semiconductor layer may partially fill the first recess R1 and fill the first hole H1. In addition, the first portion 13a of the second semiconductor layer may partially fill the second recess R2 and fill the second hole H2. In addition, the first portion 13a of the second semiconductor layer may partially fill the third recess R3 and fill the third hole H3. The first portion 13a of the second semiconductor layer may fill the fourth recess R4 and the fourth hole H4.

Figure 5D:
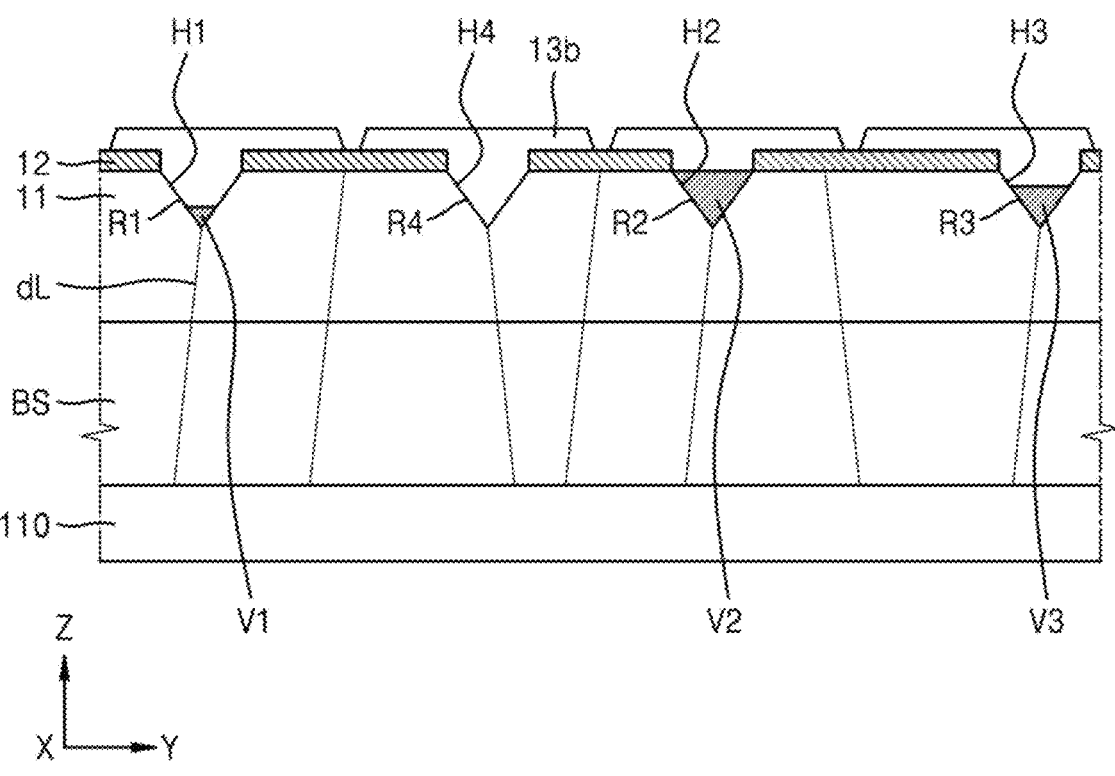

Referring to FIGS. 5D and 6C, a second portion 13b of the second semiconductor layer 13 may be formed by laterally growing the first portion 13a (refer to FIG. 5C) of the second semiconductor layer. In some embodiments, the operation of forming the first portion 13a of the second semiconductor layer 13 (see FIG. 5C) may be performed at a first temperature, the operation of forming the second portion 13b of the second semiconductor layer 13 may be performed at a second temperature, and the second temperature may be greater than the first temperature. In some embodiments, the operation of forming the first portion 13a (see FIG. 5C) of the second semiconductor layer may be performed at a first pressure, the operation of forming of the second portion 13b of the second semiconductor layer may be performed at a second pressure, and the second pressure may be lower than the first pressure.

Figure 5E:
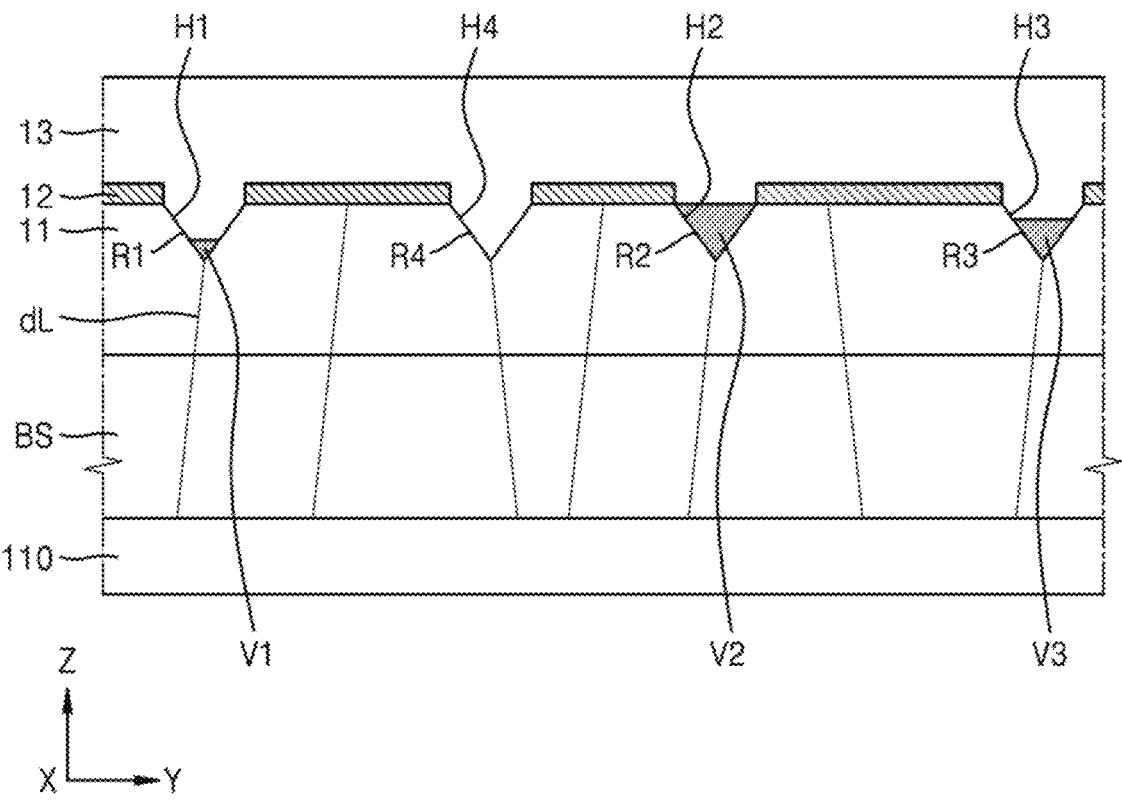

Referring to FIG. 5E, the remaining portion of the second semiconductor layer 13 may be formed by growing the second portion 13b (refer to FIG. 5D) of the second semiconductor layer.

Referring to FIGS. 1A and 6D, the third semiconductor layer 14, the active layer 15, and the fourth semiconductor layer 16 may be sequentially formed on the second semiconductor layer 13. Thereby, the light emitting stack LS shown in FIGS. 1A and 6D may be manufactured.

In some embodiments, during the process shown in FIG. 5B, that is, the deposition of the dislocation blocking layer 12 and the etching of the first semiconductor layer 11 are performed, the dislocation blocking layer 12 may be deposited on inner sides of the plurality of recesses R1 to R3 of the first semiconductor layer 11. In this case, the light emitting stack LS-1 shown in FIG. 1B may be manufactured.

FIGS. 7A, 7B, 7C, 7D, 7E, 7F, 7G, 7H, 7I, 7J, 7K, 7L and 7M are cross-sectional views illustrating a method of manufacturing a semiconductor device, according to an example embodiment.

Figure 7A:
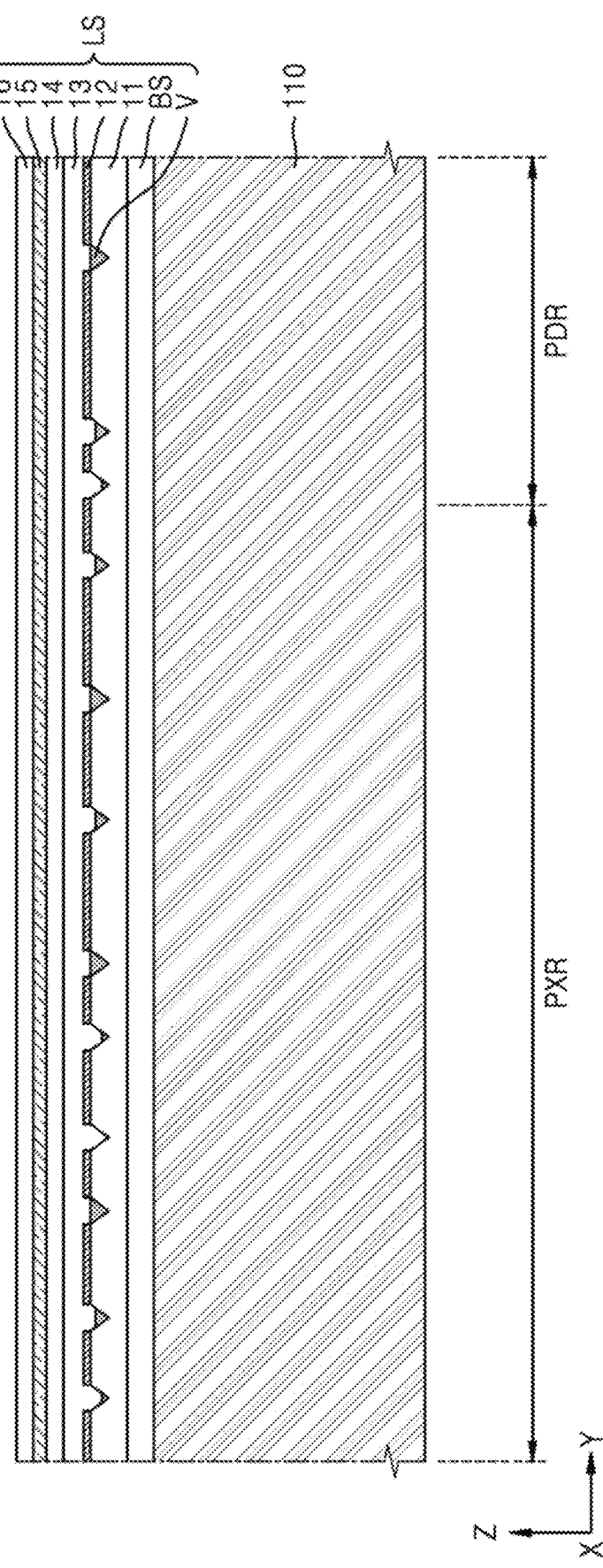

Referring to FIG. 7A, a light emitting stack LS may be formed on a substrate 110. The substrate 110 may include, for example, a Si substrate. The substrate 110 may include a portion within a pixel region PXR and a portion within a pad region PDR. As described with reference to FIG. 2, in a plan view, the pad region PDR may surround the pixel region PXR. The light emitting stack LS may be manufactured according to the manufacturing method described above with reference to FIGS. 1A, 1B, 5A to 5E, and 6A to 6D.

Figure 7B:
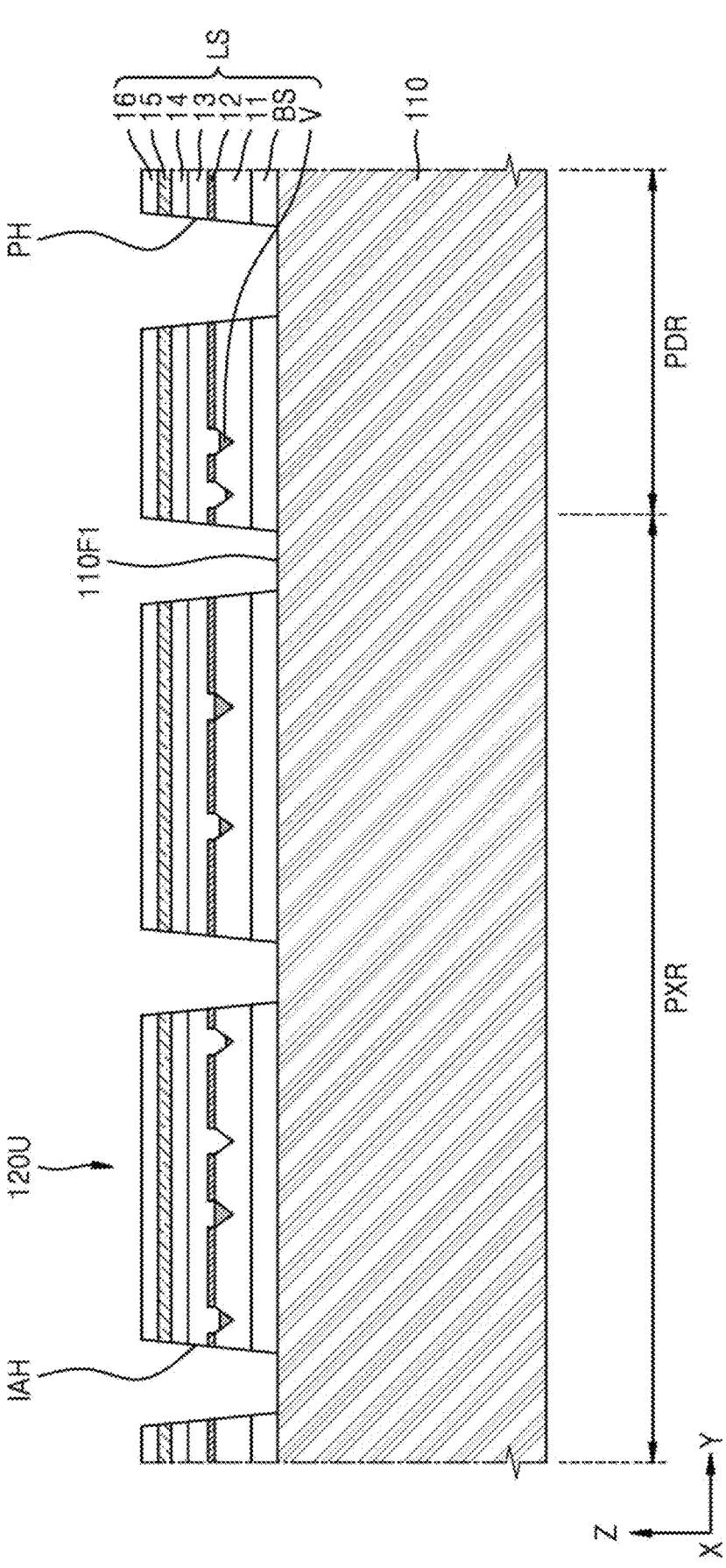

Referring to FIG. 7B, by removing a portion of the light emitting stack LS, an isolation opening IAH and a pad opening PH may be formed in the pixel region PXR and the pad region PDR, respectively. The isolation opening IAH and the pad opening PH may completely penetrate the light emitting stack LS to expose a first surface 110F1 of the substrate 110. The light emitting stack LS may be divided into a plurality of light emitting structures 120U by the isolation opening IAH in the pixel region PXR. In some embodiments, the process of forming the isolation opening IAH may be performed by a blade.

Figure 7C:
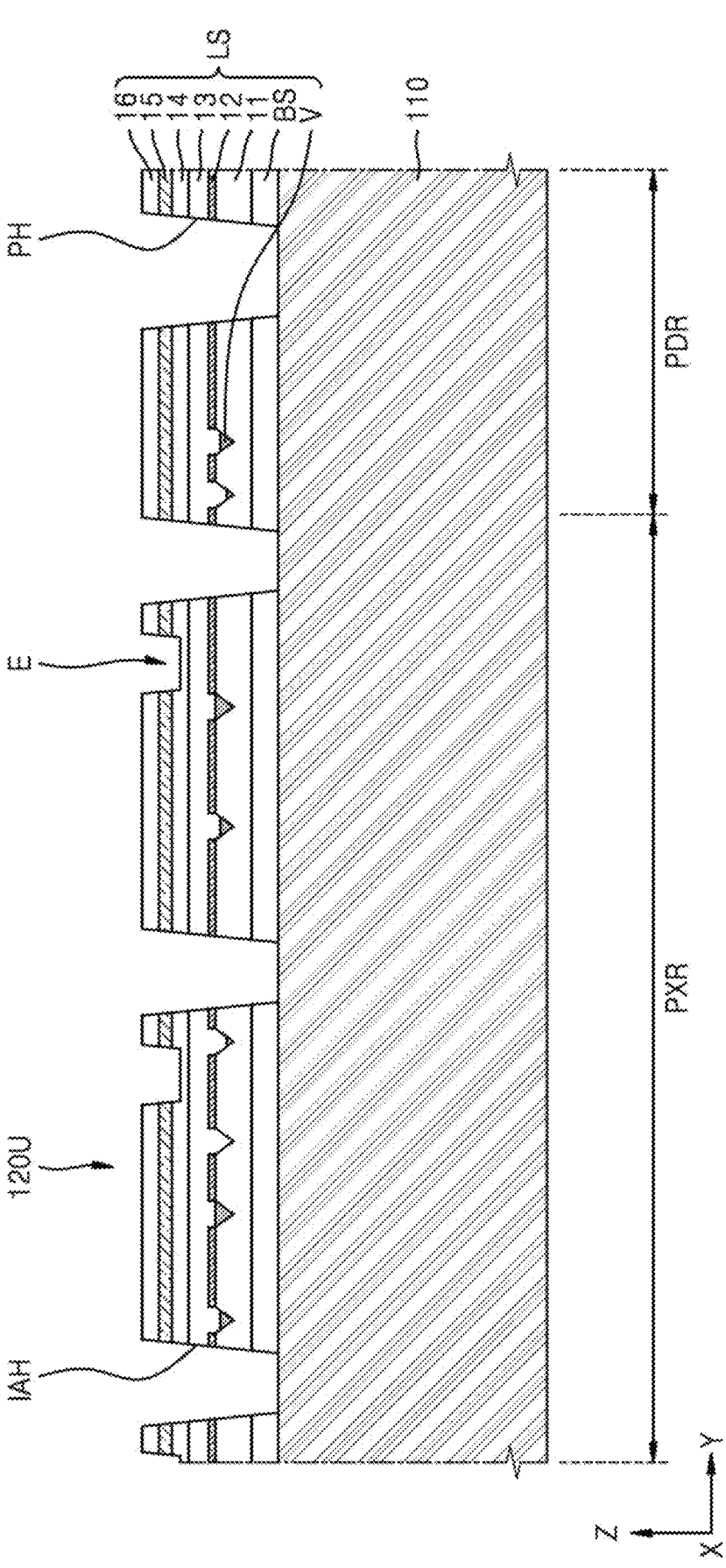

Referring to FIG. 7C, an opening E may be formed in the light emitting structure 120U by removing a portion of the light emitting structure 120U from the pixel region PXR. The opening E may penetrate the fourth semiconductor layer 16 and the active layer 15 to expose a third semiconductor layer 14.

Figure 7D:
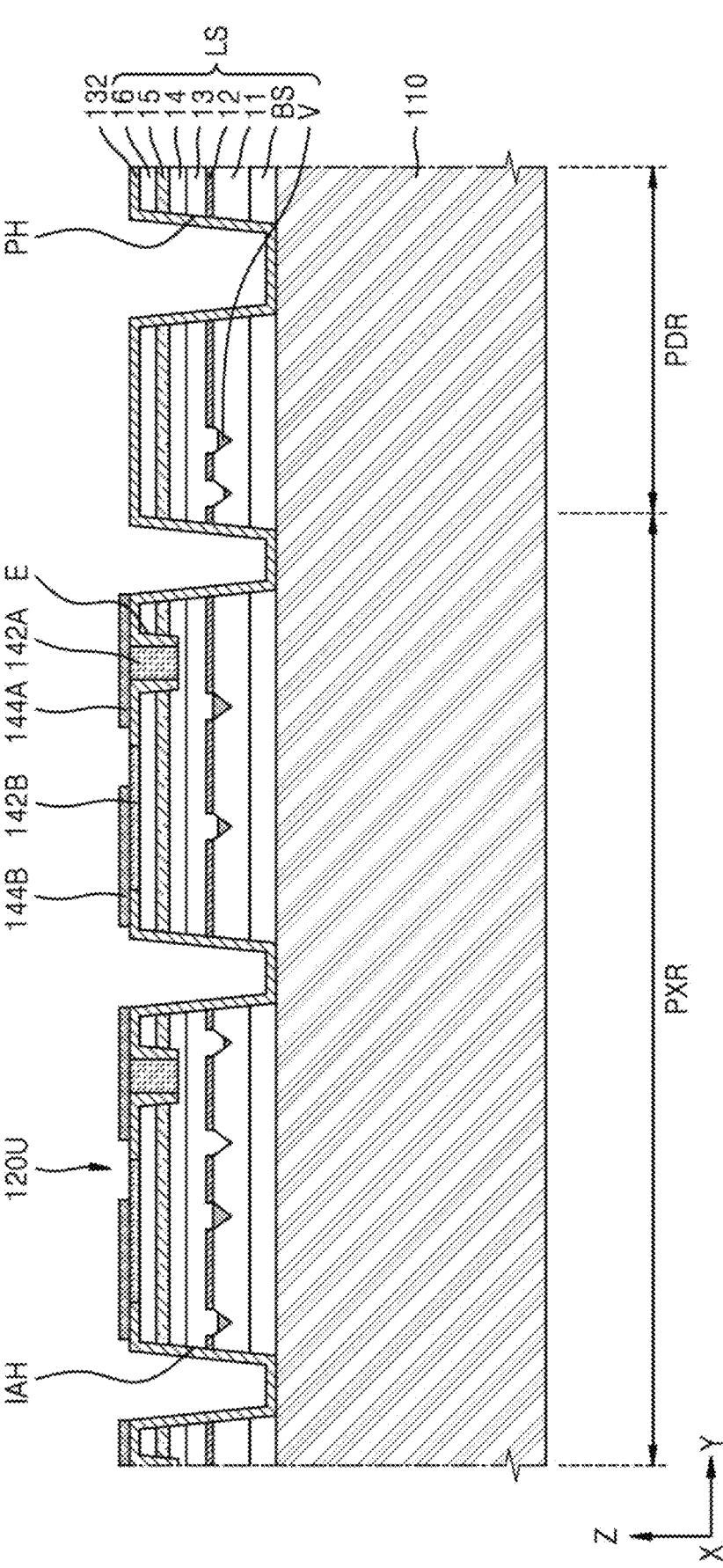

Referring to FIG. 7D, a first insulating layer 132 may be formed on the light emitting structure 120U, the light emitting stack LS, and the substrate 110. The first insulating layer 132 may conformally cover the opening E, the isolation opening IAH, and the pad opening PH, and may extend on the upper surface and side surfaces of the light emitting structure 120U and the upper surface of the substrate 110. The first insulating layer 132 may be formed in both the pixel region PXR and the pad region PDR.

An upper surface of the third semiconductor layer 14 may be exposed by removing a portion of the first insulating layer 132 on the third semiconductor layer 14 in the opening E. A first electrode 142A may be formed on the upper surface of the third semiconductor layer 14. In some embodiments, a first contact layer formed of a conductive ohmic material may be further formed between the first electrode 142A and the third semiconductor layer 14. A first connection electrode 144A electrically connected to the first electrode 142A may be formed on the first insulating layer 132.

On the other hand, the upper surface of the fourth semiconductor layer 16 may be exposed by removing a portion of the first insulating layer 132 on the fourth semiconductor layer 16. A second electrode 142B may be formed on the upper surface of the fourth semiconductor layer 16. In some embodiments, a second contact layer formed of a conductive ohmic material may be further formed between the second electrode 142B and the fourth semiconductor layer 16. A second connection electrode 144B electrically connected to the second electrode 142B may be formed on the first insulating layer 132.

Figure 7E:
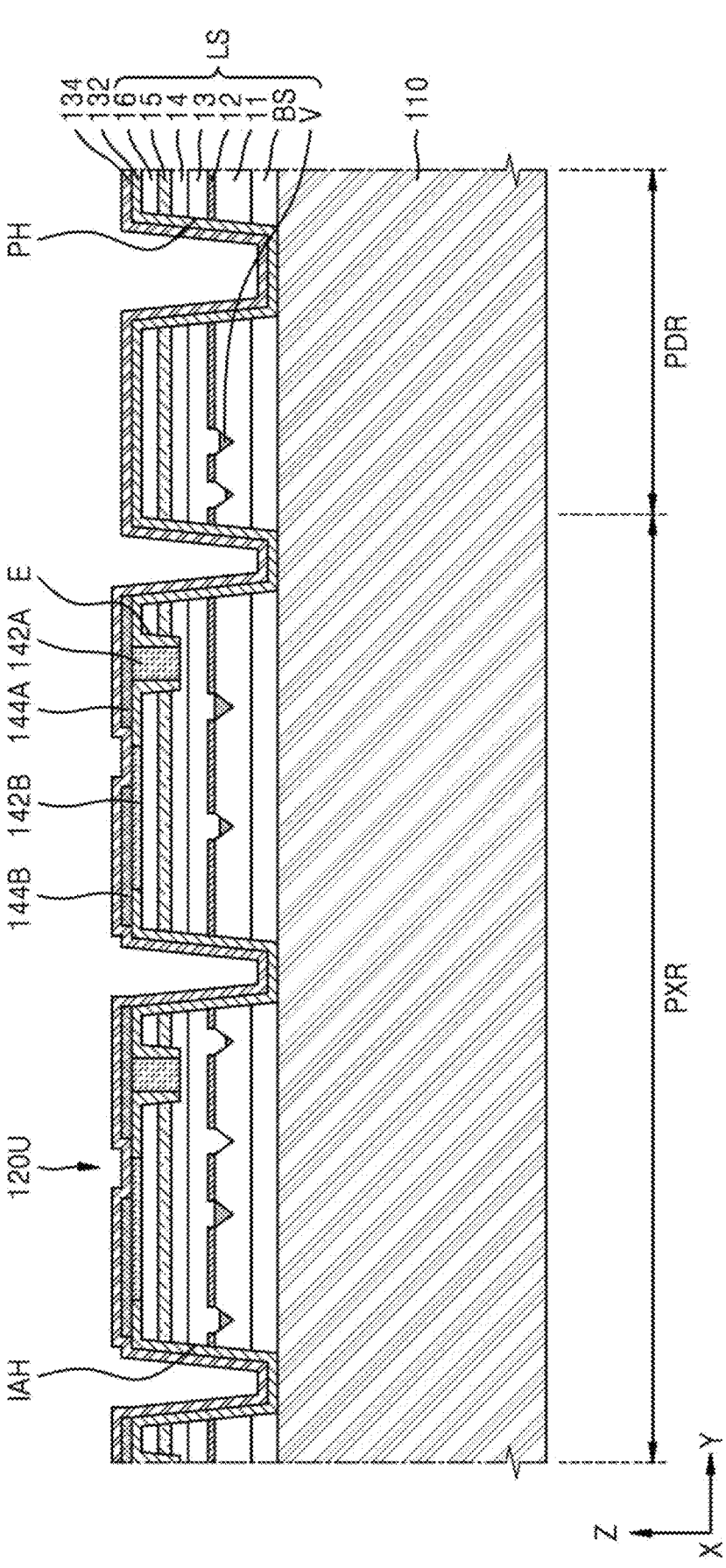

Referring to FIG. 7E, a second insulating layer 134 may be conformally formed on the first connection electrode 144A, the second connection electrode 144B, and the first insulating layer 132.

Figure 7F:
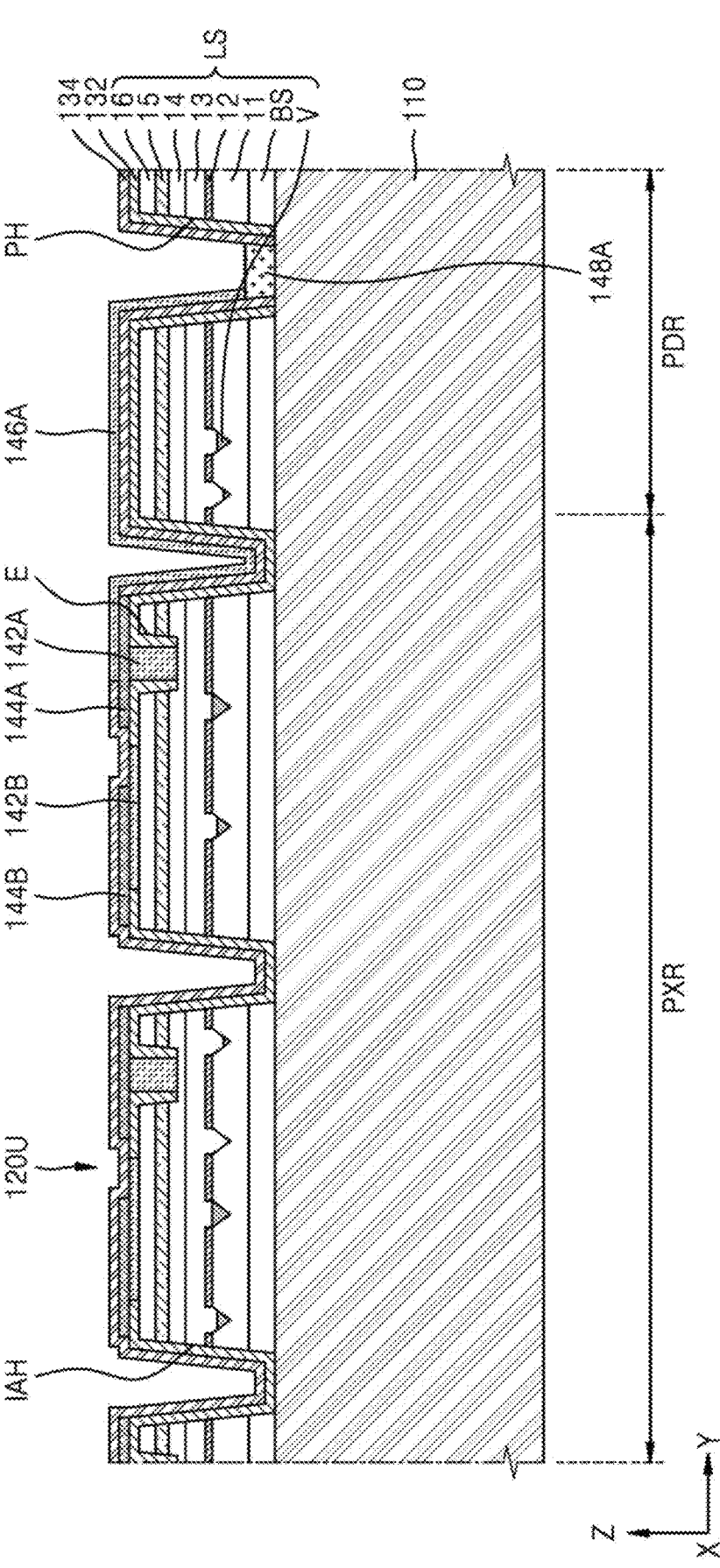

Referring to FIG. 7F, the upper surface of the first connection electrode 144A may be exposed by removing a portion of the second insulating layer 134. In addition, a first surface 110F1 of the substrate 110 may be exposed by removing portions of the first insulating layer 132 and the second insulating layer 134 exposed through the pad opening PH. A first wiring pattern 146A may be formed on the second insulating layer 134. In addition, a first pad 148A may be formed in the pad opening PH. In some embodiments, after the first wiring pattern 146A is formed, the first pad 148A may be formed. In other embodiments, in the process for forming the first wiring pattern 146A, the first pad 148A may be formed together.

Figure 7G:
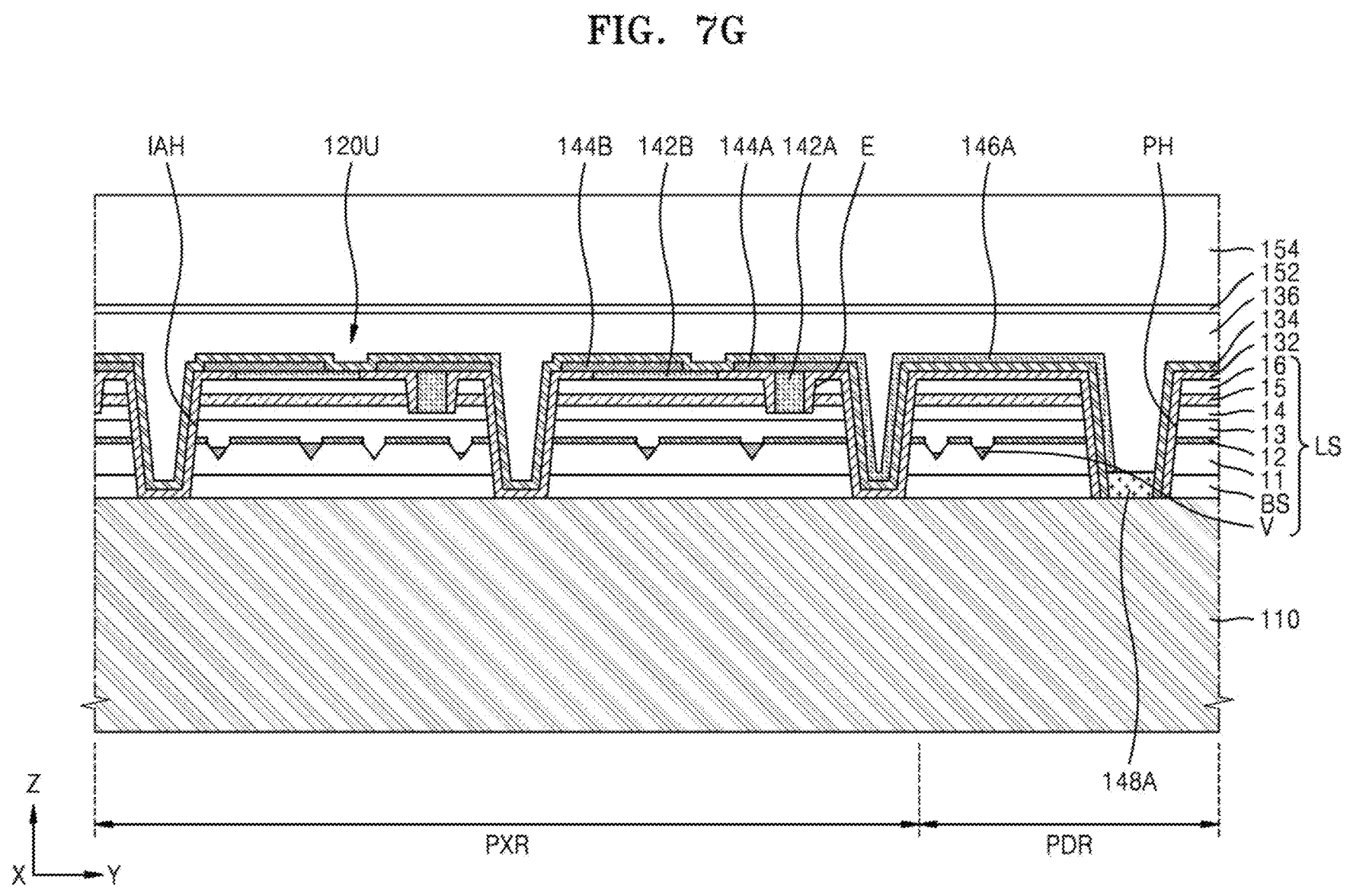

Referring to FIG. 7G, a buried insulating layer 136 may be formed on the second insulating layer 134, the first wiring pattern 146A, and the first pad 148A. The buried insulating layer 136 may fill residual spaces in the isolation opening IAH and the pad opening PH. A buried insulating layer 136 may then be attached to a support substrate 154 using an adhesive layer 152.

Figure 7H:
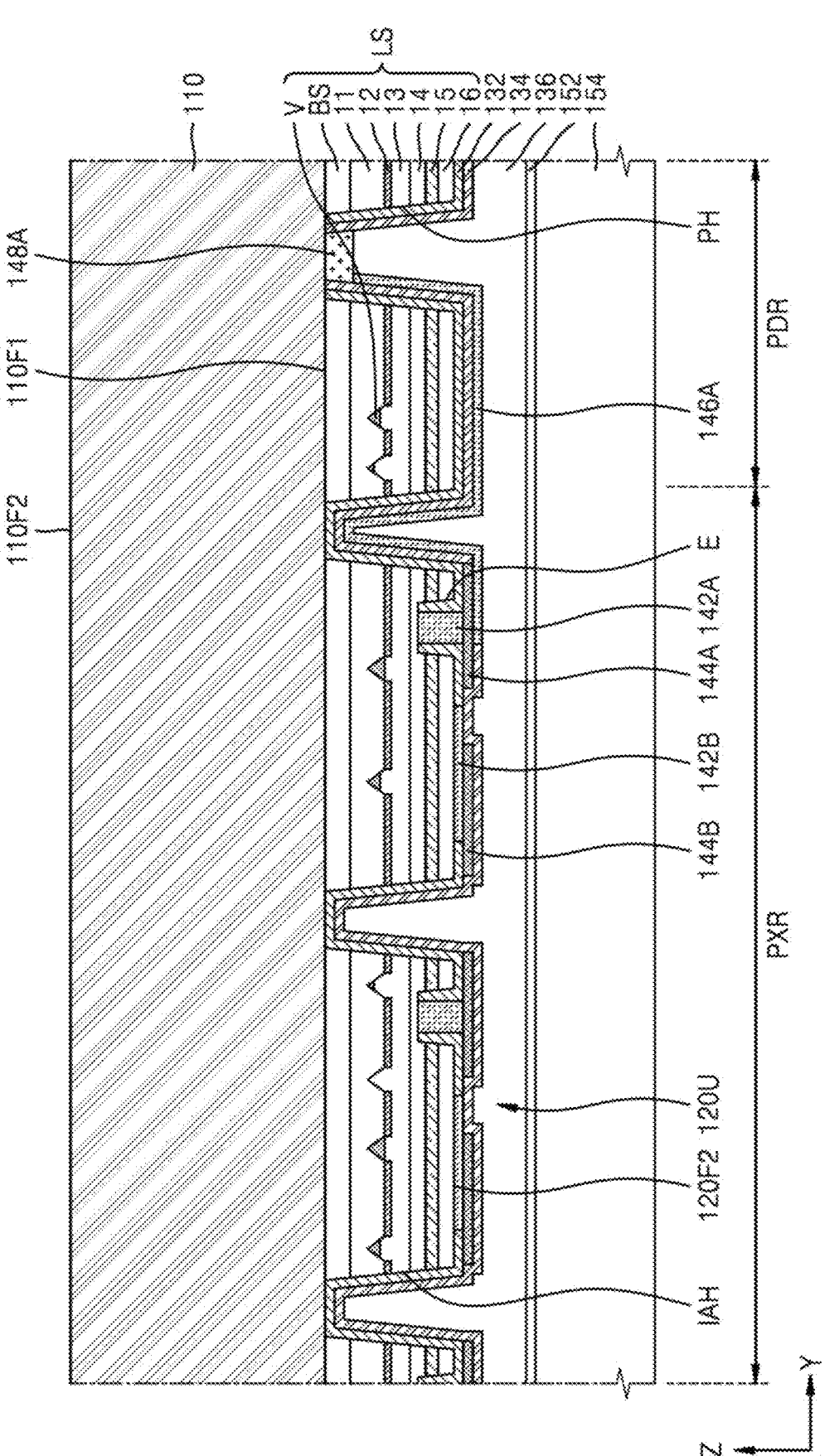

Referring to FIG. 7H, by removing the upper portion of the substrate 110 from a second surface 110F2 of the substrate 110 by a grinding process, the substrate 110 may be thin.

Figure 7I:
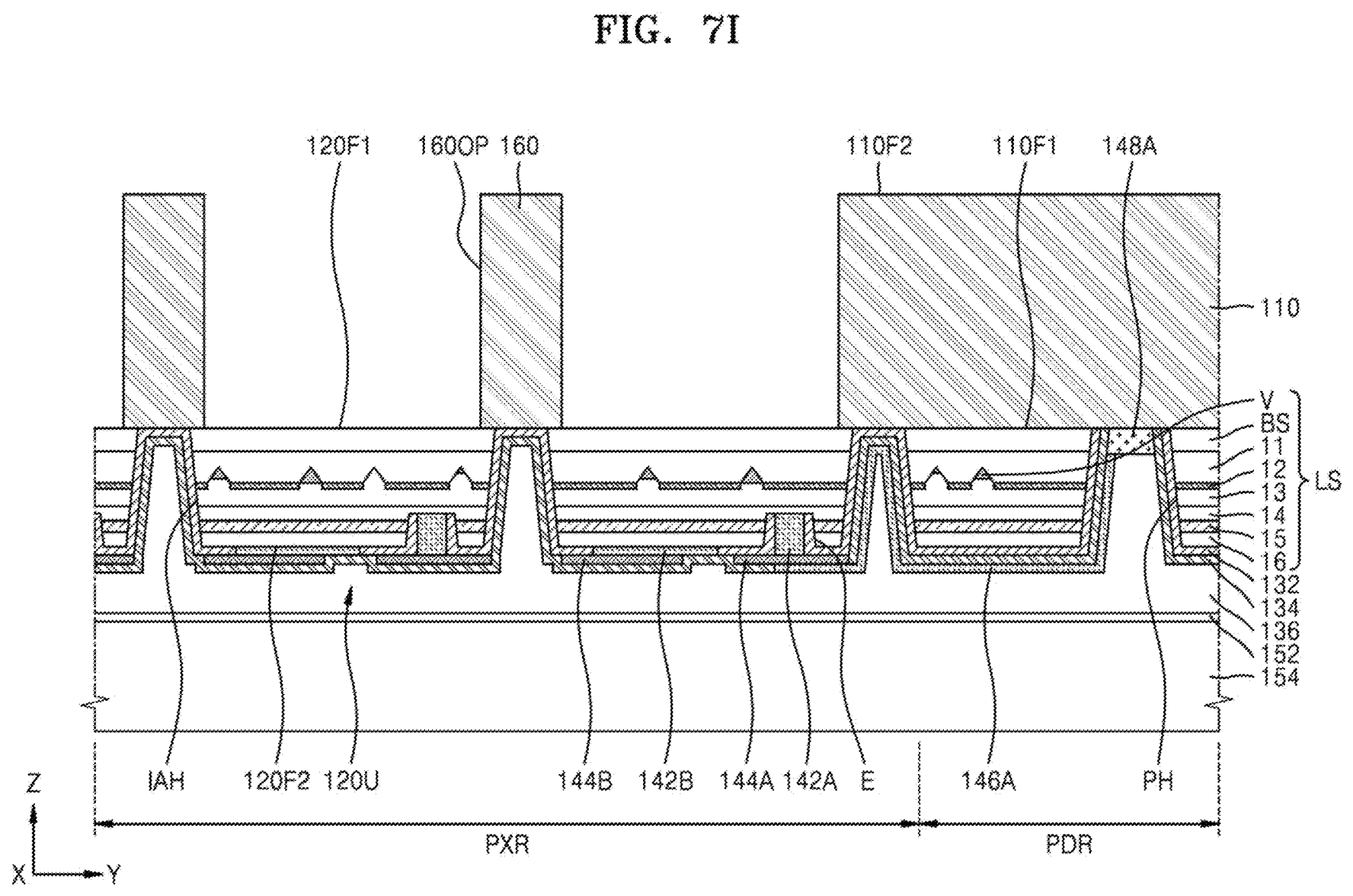

Referring to FIG. 7I, by forming a mask pattern on the second surface 110F2 of the substrate 110 and removing a portion of the substrate 110 using the mask pattern as an etching mask, a plurality of openings 160OP passing through the thickness of the substrate 110 may be formed in the pixel region PXR of the substrate 110. The plurality of openings 160OP may expose first surfaces 120F1 of the plurality of light emitting structures 120U, respectively. The opening 160OP may be formed such that the substrate 110 overlaps the peripheral portion of the light emitting structure 120U and exposes the central portion of the light emitting structure 120U. In other embodiments, the opening 160OP may be formed to expose the central and peripheral portions of the light emitting structure 120U. The substrate 110 having the plurality of openings 160OP may form the barrier rib structure 160.

Figure 7J:
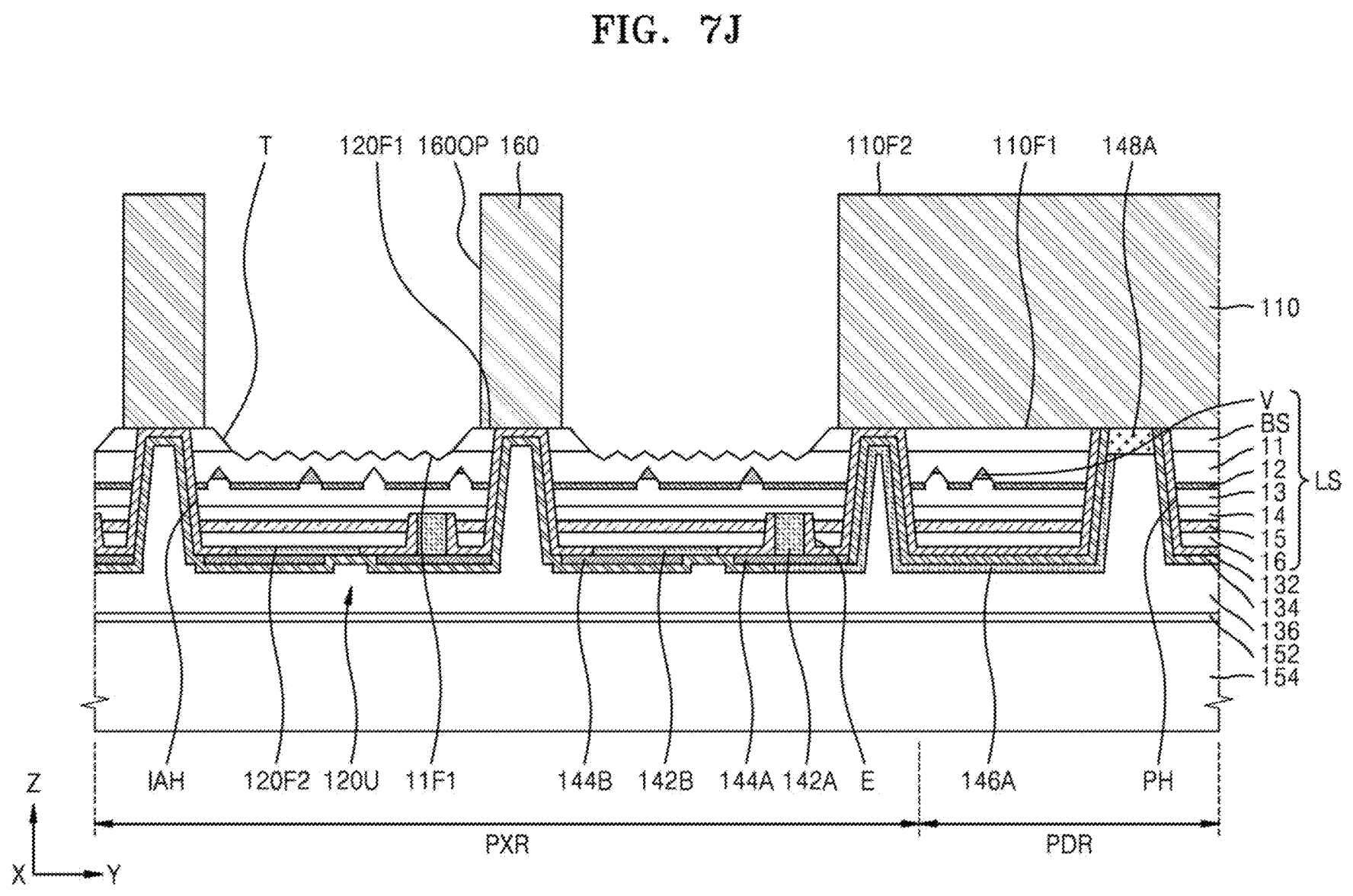

Referring to FIG. 7J, a trench T may be formed in each light emitting structure 120U by etching a portion of the buffer structure BS exposed through the plurality of openings 160OP. The trench T may expose the first semiconductor layer 11. In some embodiments, the trench T may be formed by further etching at least a portion of the first semiconductor layer 11 and the plurality of voids V. In this case, the trench T may expose the dislocation blocking layer 12 and the second semiconductor layer 13.

A portion of the buffer structure BS in the central portion of the light emitting structure 120U exposed through the opening 160OP of the substrate 110 may be removed. A portion of the buffer structure BS in the periphery of the light emitting structure 120U covered by the substrate 110 may remain. In other embodiments, the light emitting structure 120U may not be covered by the substrate 110, and in this case, the entire buffer structure BS of the light emitting structure 120U may be removed.

In some embodiments, a first surface 11F1 of the first semiconductor layer 11 may be textured so that the exposed first surface 11F1 of the first semiconductor layer 11 is roughened.

Figure 7K:
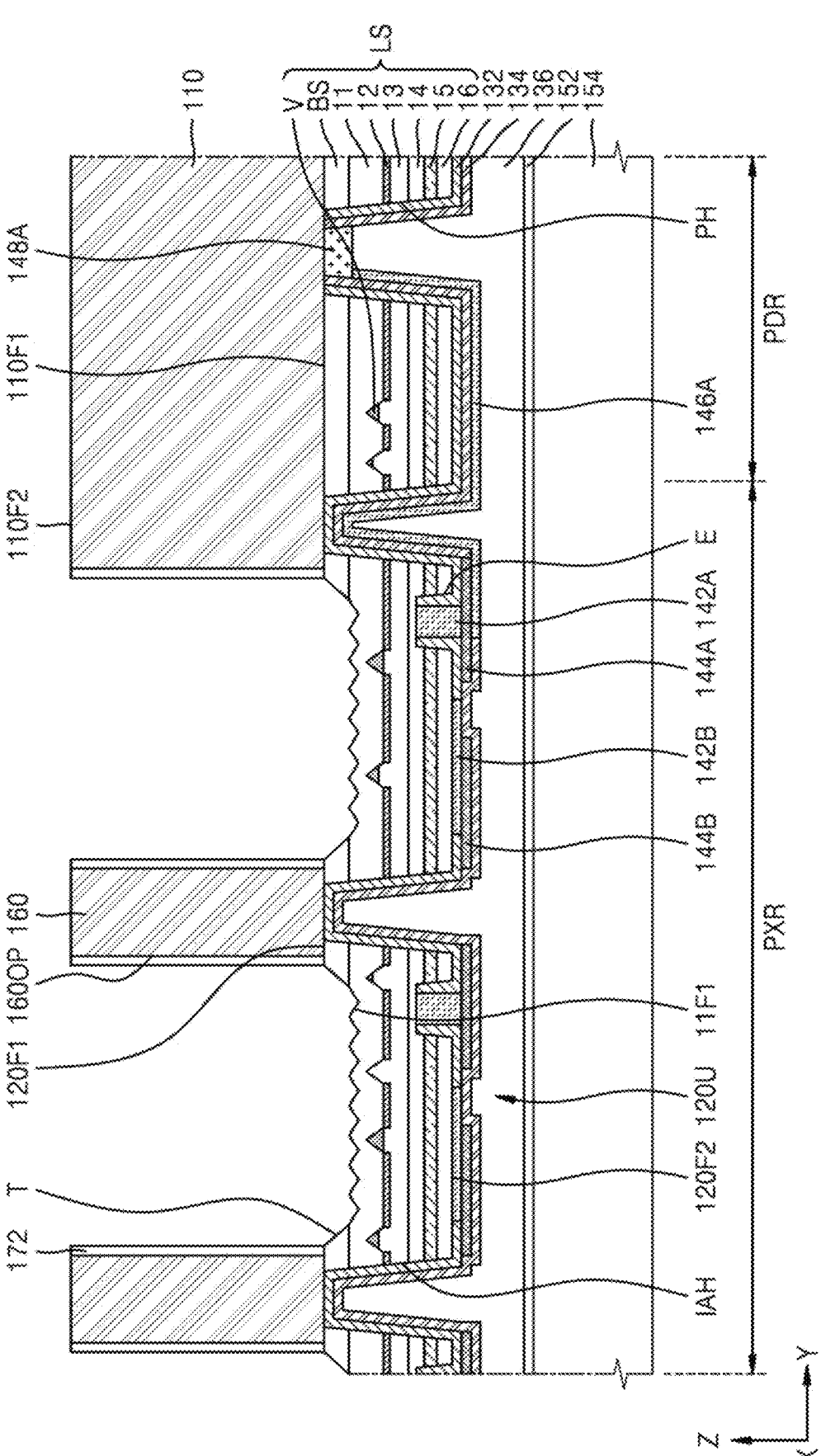

Referring to FIG. 7K, a reflective layer 172 may be formed on side surfaces of the plurality of openings 160OP of the substrate 110. For example, by forming a material layer on the substrate 110 and the light emitting structure 120U and anisotropically etching the material layer, the material layer on the upper surface of the substrate 110 and the light emitting structure 120U may be removed.

Figure 7L:
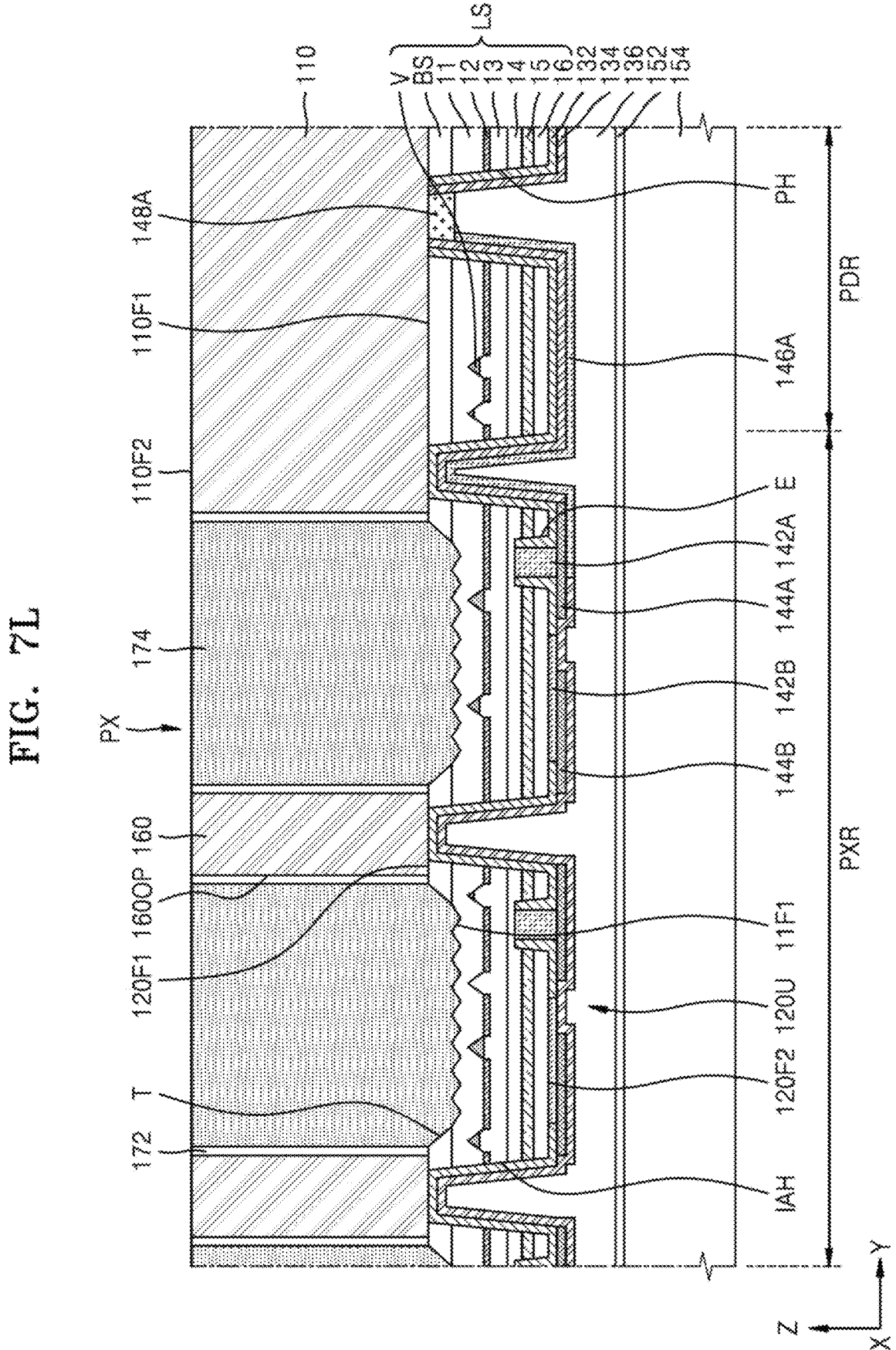

Referring to FIG. 7L, a fluorescent layer 174 may be formed in the trench T of the light emitting structure 120U and the opening 160OP of the substrate 110. For example, the fluorescent layer 174 may be formed by applying or dispensing a resin in which phosphor particles are dispersed in the opening 160OP and the trench T. The fluorescent layer 174 may include two or more kinds of phosphor particles having different size distributions so that the phosphor is uniformly dispersed in the opening 160OP and the trench T.

Figure 7M:
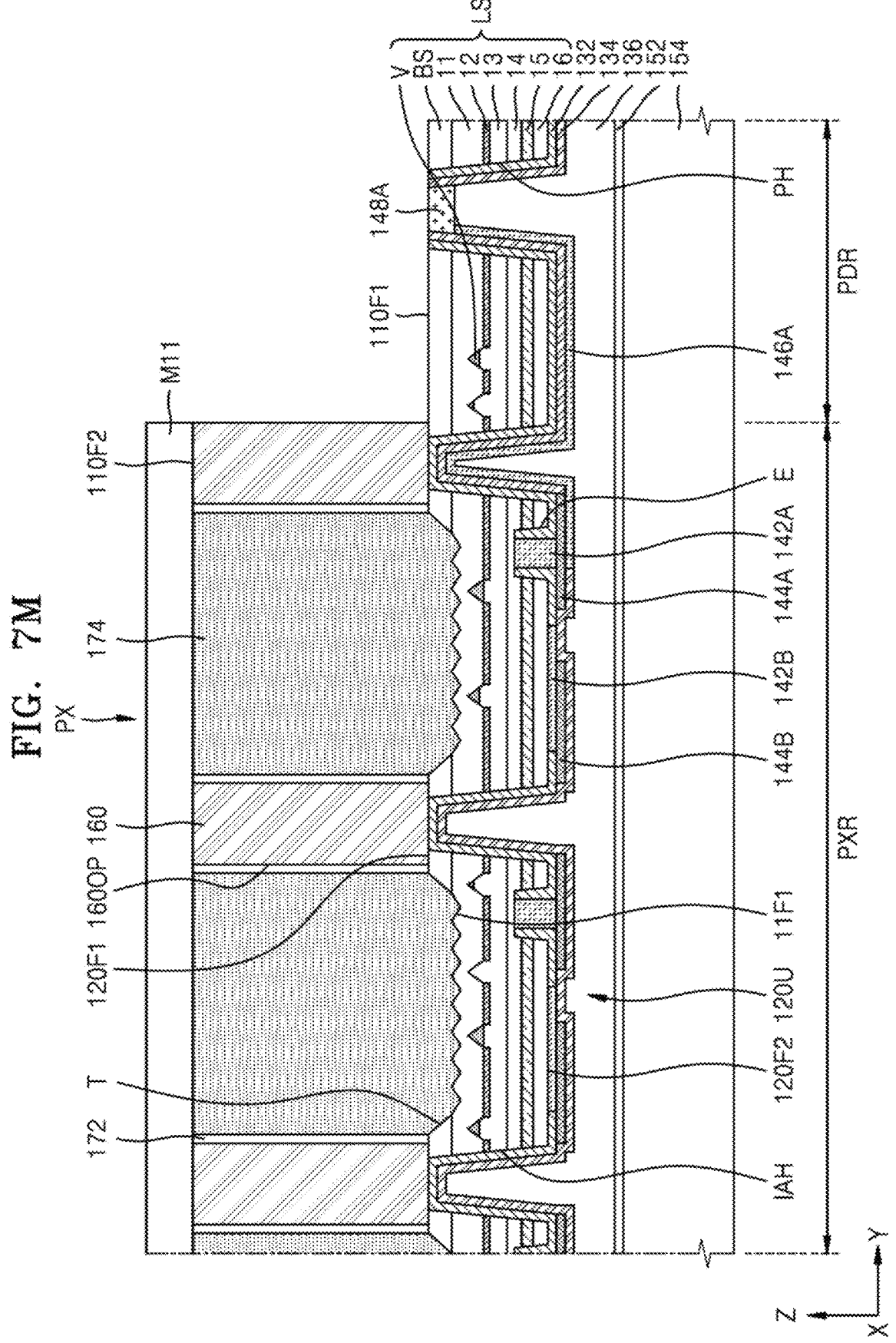

Referring to FIG. 7M, a mask pattern M11 exposing a portion of the substrate 110 in the pad region PDR may be formed on a portion of the substrate 110 in the pixel region PXR. The light emitting stack LS in the pad region PDR and the first pad 148A may be exposed by removing a portion of the substrate 110 using the mask pattern M11 as an etch mask. The mask pattern M11 may be removed.

The light emitting devices 100, 100*a*, and 100*b* of FIGS. 4A to 4C may be manufactured by the manufacturing method described with reference to FIGS. 7A to 7M.

Figure 8:
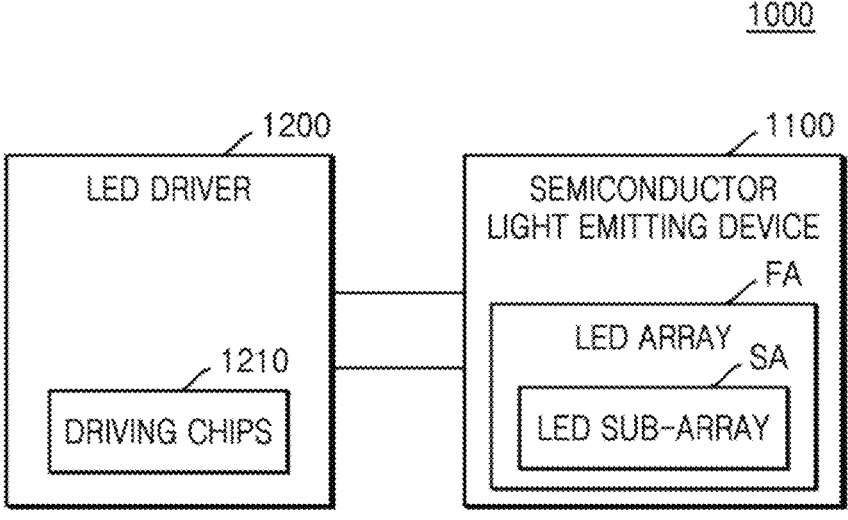
FIG. 8 is a block diagram illustrating a light source module according to an embodiment.

FIG. 8 is a block diagram illustrating a light source module 1000 according to an embodiment.

Referring to FIG. 8, the light source module 1000 may include a semiconductor light emitting device 1100 and an LED driver 1200. The semiconductor light emitting device 1100 may include an LED array FA including a plurality of light emitting diodes (LEDs). In some embodiments, one LED array FA may include a plurality of sub-arrays SA. LEDs included in different sub-arrays SA may be electrically separated from each other. The semiconductor light emitting device 1100 may be, for example, one of the light emitting devices 100, 100*a* and 100*b* described with reference to FIGS. 4A to 4C.

The LED driver 1200 may include a plurality of driving chips 1210. Each of the plurality of driving chips 210 may be an integrated circuit (IC) chip. Each of the plurality of driving chips 210 may be electrically connected to a corresponding sub-array SA, and may control the operation of LEDs in the sub-array SA. In some embodiments, the number of driving chips 1210 included in the LED driver 1200 may be the same as the number of sub-arrays SA included in the semiconductor light emitting device 1100. In other embodiments, the number of driving chips 1210 included in the LED driver 1200 may be different from the number of the plurality of sub-arrays SA included in the semiconductor light emitting device 1100. For example, a plurality of sub-arrays SA may be controlled by one driving chip 1210 or one sub-array SA may be controlled by a plurality of driving chips 1210.

Contrary to that shown in FIG. 8, in some embodiments, the LED array FA in the semiconductor light emitting device 1100 may not be divided into a plurality of sub-arrays SA. Each of the driving chips 1210 may control the operation of LEDs in the corresponding array FA. In some embodiments, the number of driving chips 1210 included in the LED driver 1200 may be the same as the number of arrays FA included in the semiconductor light emitting device 1100.

The LED driver 1200 may be connected to a power supply, and the power supply may generate an input voltage required for the semiconductor light emitting device 1100 to operate, and may be provided to the semiconductor light emitting device 1100. In an embodiment, when the light source module 1000 is a headlamp for a vehicle, the power supply may be a battery mounted in the vehicle. In one embodiment, when the light source module 1000 is a home or business lighting device, the light source module 1000 may further include an AC power source for generating an AC voltage, a rectifier circuit for generating a DC voltage by rectifying the AC voltage, and a voltage regulator circuit.

Figure 9:
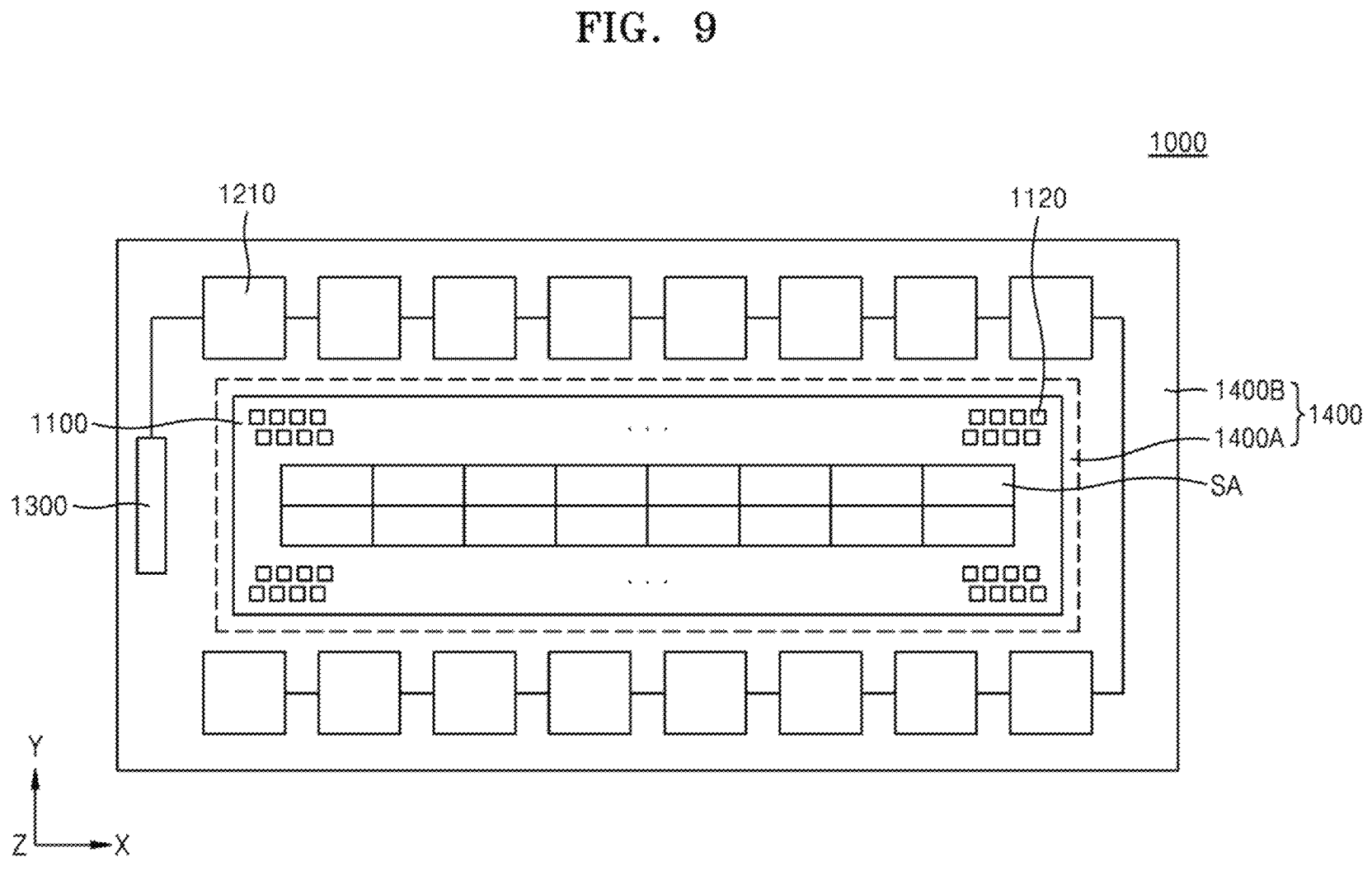

FIG. 9 is a plan view illustrating a light source module 1000 according to an embodiment.

Referring to FIG. 9, the light source module 1000 may include a circuit board 1400, a semiconductor light emitting device 1100 mounted on the circuit board 1400, and a plurality of driving chips 1210. In some embodiments, the semiconductor light emitting device 1100 may be implemented as a single chip. In some embodiments, the length of the semiconductor light emitting device 1100 chip in the X direction may be greater than the length of the semiconductor light emitting device 1100 chip in the Y direction.

The circuit board 1400 may be, for example, a printed circuit board (PCB). The circuit board 1400 may have a central region 1400A and a peripheral region 1400B surrounding the central region. In some embodiments, the semiconductor light emitting device 1100 may be disposed on the central region 1400A of the circuit board 1400, and the plurality of driving chips 1210 may be disposed on the peripheral region 1400B of the circuit board 1400.

The semiconductor light emitting device 1100 may include an LED array. The LED array may be divided into a plurality of sub-arrays SA. Although FIG. 9 shows that the semiconductor light emitting device 1100 includes 16 sub-arrays SA, embodiments are not limited thereto and the number of sub-arrays SA included in the semiconductor light emitting device 1100 may be greater than or less than 16. In addition, although it is shown in FIG. 9 that the sub-arrays SA are arranged in 8 columns and 2 rows, the arrangement of the sub-arrays SA may be modified. Each of the sub-arrays SA may be driven by a corresponding driving chip 1210. In the light emitting devices 100, 100*a*, and 100*b* described with reference to FIGS. 4A to 4C, one light emitting structure 120U may correspond to one LED.

The light source module 1000 may further include an input interface 1300 for receiving signals necessary for the operation of the light source module 1000 from the outside of the light source module 1000. For example, the plurality of driving chips 1210 may receive a control signal for controlling the operations of the plurality of arrays SA, respectively, through the input interface 1300. In addition, the plurality of driving chips 1210 may receive driving power through the input interface 1300. In some embodiments, the plurality of driving chips 1210 may be sequentially electrically connected. Accordingly, for example, a control signal may be sequentially transmitted from the input interface 1300 to the plurality of driving chips 1210.

Pads 1120 for connecting the semiconductor light emitting device 1100 to the plurality of driving chips 1210 may be disposed on the light emitting surface on which the semiconductor light emitting device 1100 emits light. The pad 1120 may be the first pad 148A or the second pad 148B described with reference to FIGS. 2 and 3. In the semiconductor light emitting devices 100, 100*a*, and 100*b* described with reference to FIGS. 4A to 4C, the light emitting surface may be the first surface 120F1 of the stacked structure 120. However, in other embodiments, the pads 1120 may be disposed on a surface opposite to the light emitting surface.

Figure 10:
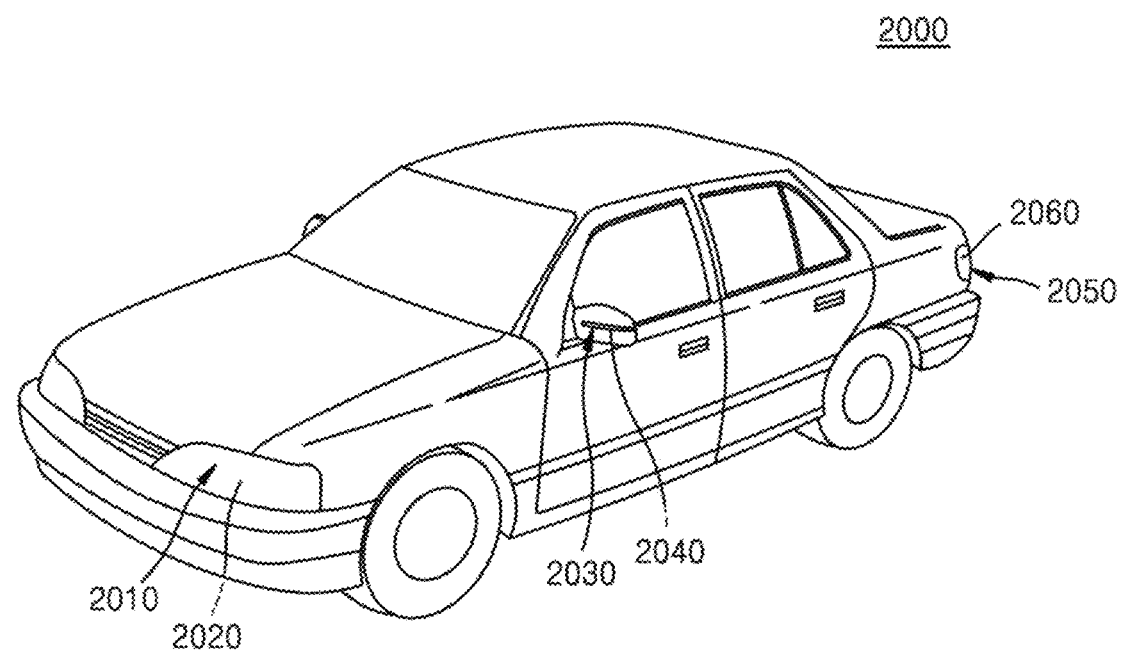
FIG. 10 is a perspective view schematically illustrating a lighting device according to an embodiment.

FIG. 10 is a perspective view schematically illustrating a lighting device 2000 according to an embodiment.

Referring to FIG. 10, the head lamp module 2020 may be installed in the head lamp 2010 of the vehicle. A side mirror lamp module 2040 may be installed in an exterior side mirror 2030 of the vehicle. A tail lamp module 2060 may be installed in a tail lamp 2050. At least one of the head lamp module 2020, the side mirror lamp module 2040, and the tail lamp module 2060 may include the light source module 1000 described with reference to FIGS. 8 and 9.

Figure 11:
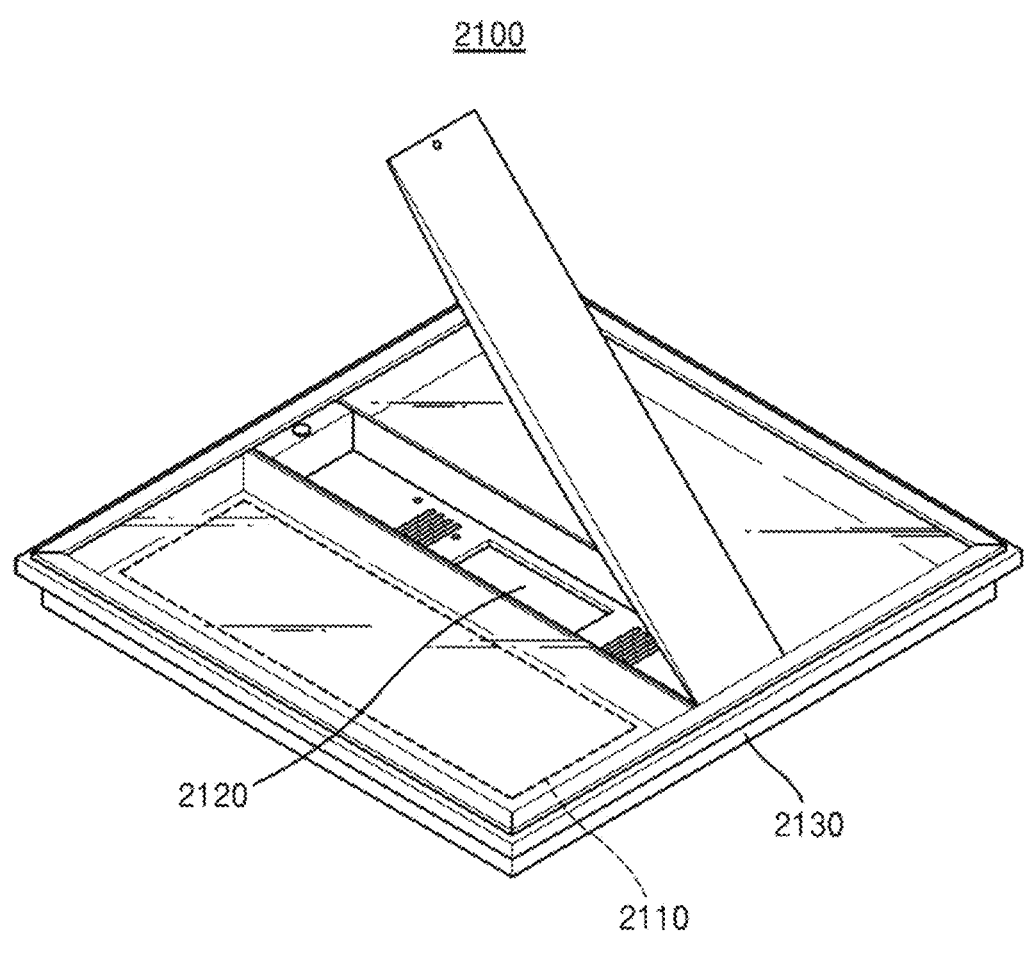
FIG. 11 is a perspective view schematically illustrating a lighting device according to an embodiment.

FIG. 11 is a perspective view schematically illustrating a lighting device according to an embodiment.

Referring to FIG. 11, a flat panel lighting device 2100 may include a light source module 2110, a power supply device 2120, and a housing 2130. The light source module 2110 may be the light source module 1000 described with reference to FIGS. 8 and 9, and may include at least one of the semiconductor light emitting devices 100, 100a or 100b described with reference to FIGS. 4A to 4C. The light source module 2110 may be formed to have a planar shape as a whole.

The power supply device 2120 may be configured to supply power to the light source module 2110. The housing 2130 may have an accommodation space in which the light source module 2110 and the power supply device 2120 are accommodated therein, and may be formed in a hexahedral shape with on one side open, but embodiments are not limited thereto. The light source module 2110 may be disposed to emit light to one open side of the housing 2130.

Figure 12:
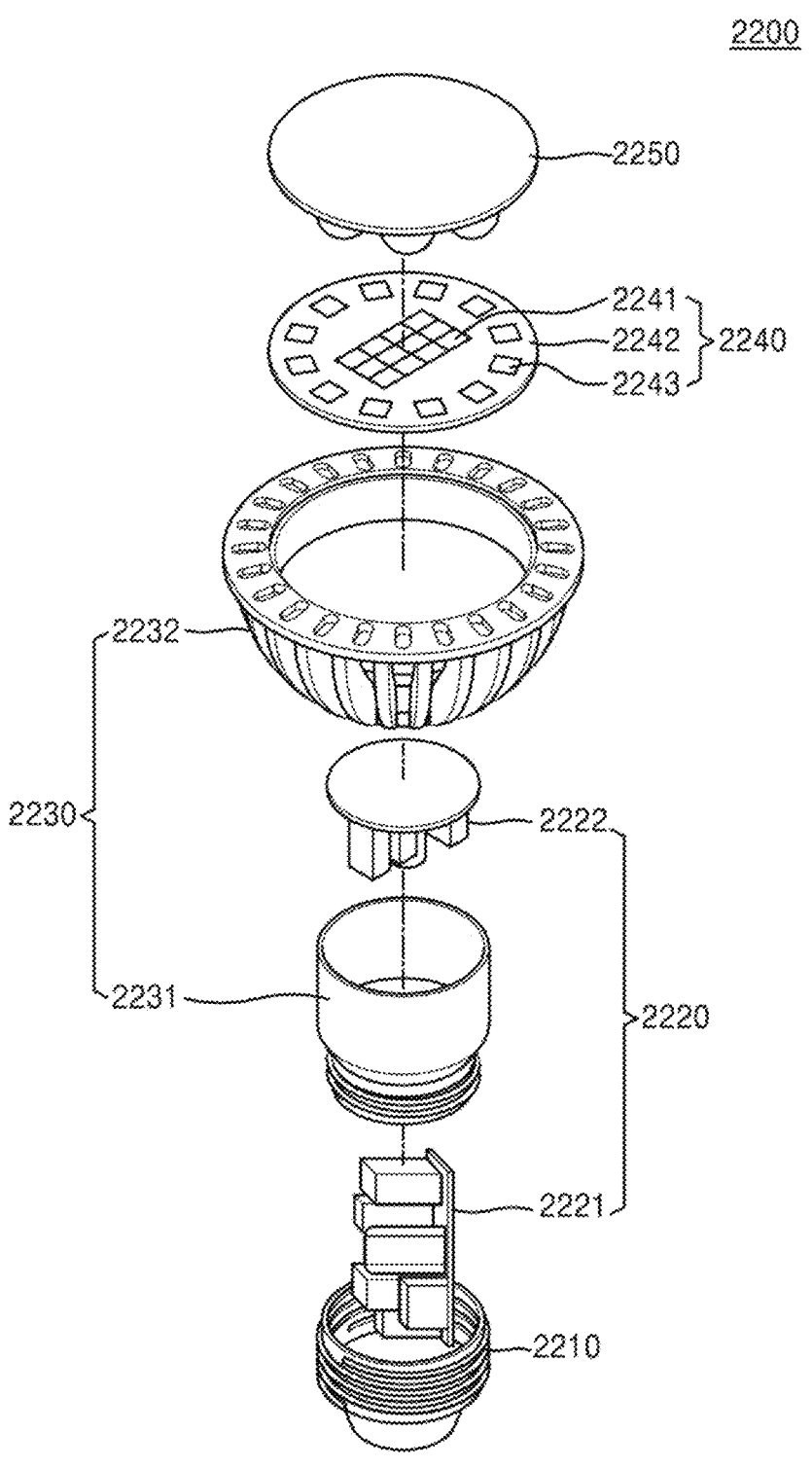
FIG. 12 is an exploded perspective view schematically illustrating a lighting device according to an embodiment.

FIG. 12 is an exploded perspective view schematically illustrating a lighting device 2200 according to an embodiment.

Referring to FIG. 12, the lighting device 2200 may include a socket 2210, a power supply 2220, a heat dissipation portion 2230, a light source module 2240, and an optical portion 2250. The socket 2210 may be configured to be replaceable with an existing lighting device. Power supplied to the lighting device 2200 may be applied through the socket 2210. The power source 2220 may be separated and assembled into a first power source 2221 and a second power source 2222. The heat dissipation portion 2230 may include an internal heat dissipation portion 2231 and an external heat dissipation portion 2232, the internal heat dissipation portion 2231 may be directly connected to the light source module 2240 and/or the power supply 2220, and through this, heat may be transferred to the external heat dissipation portion 2232. The optical portion 2250 may include an internal optical portion and an external optical portion, and may be configured to evenly distribute light emitted by the light source module 2240.

The light source module 2240 may receive power from the power supply 2220 and emit light to the optical portion 2250. The light source module 2240 may include one or more light emitting device packages 2241, a circuit board 2242, and a controller 2243, and the controller 2243 may store driving information of the light emitting device package 2241. The light emitting device package 2241 may include at least one of the light emitting devices 100, 100a or 100b described with reference to FIGS. 4A to 4C.

Figure 13:
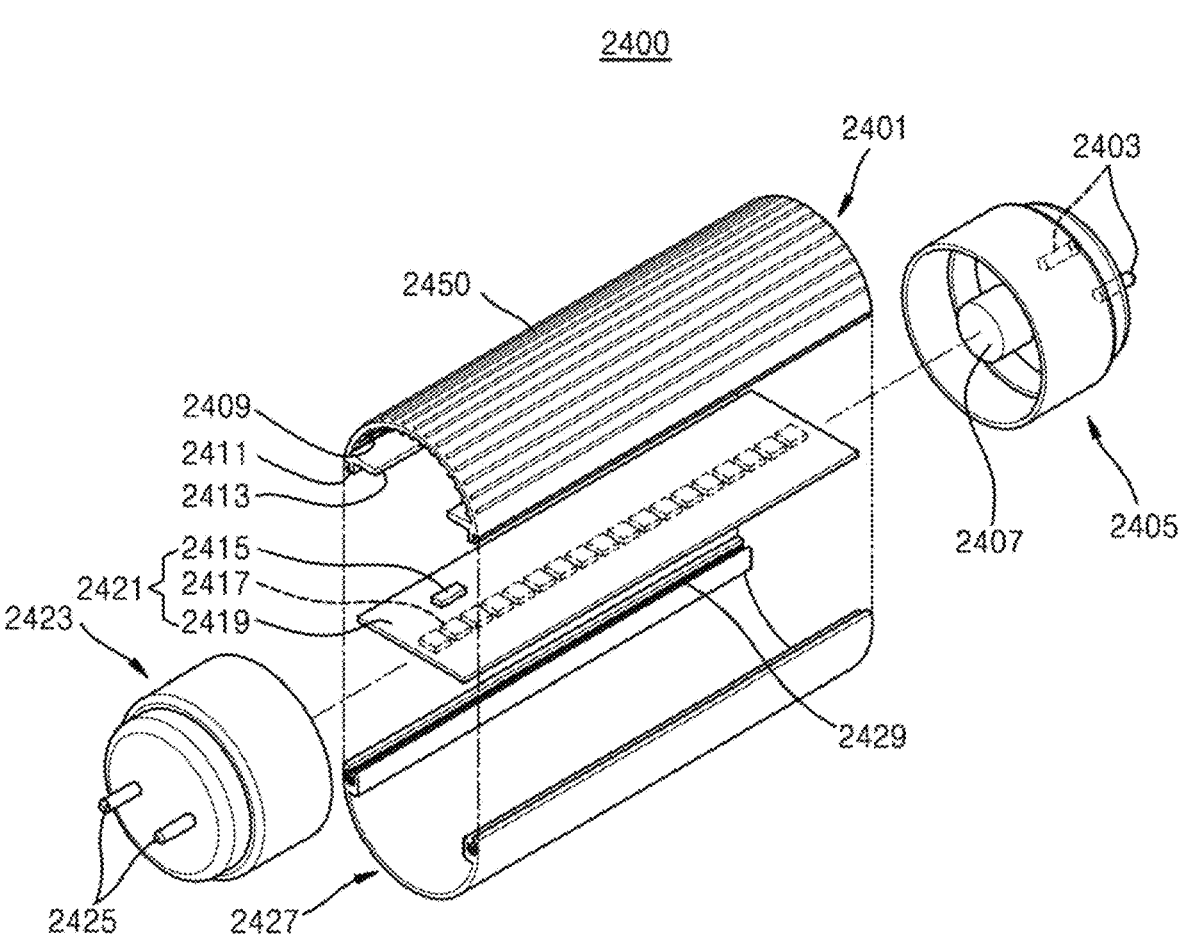
FIG. 13 is an exploded perspective view schematically illustrating a lighting device according to an embodiment.

FIG. 13 is an exploded perspective view schematically illustrating a lighting device 2400 according to an embodiment.

Referring to FIG. 13, the lighting device 2400 may include a heat dissipation member 2401, a cover 2427, a light source module 2421, a first socket 2405, and a second socket 2423. A plurality of heat dissipation fins 2450 and 2409 may be formed in an uneven shape on the inner or/and outer surface of the heat dissipation member 2401, and the heat dissipation fins 2450 and 2409 may be designed to have various shapes and spacing. A protruding support 2413 is formed inside the heat dissipation member 2401. The light source module 2421 may be fixed to the support 2413. Locking protrusions 2411 may be formed at both ends of the heat dissipation member 2401.

A locking groove 2429 is formed in the cover 2427, and a hooking protrusion 2411 of the heat dissipation member 2401 may be coupled to the hooking groove 2429 in a hook coupling structure. Positions in which the locking groove 2429 and the locking jaw 2411 are formed may be interchanged with each other.

The light source module 2421 may include a printed circuit board 2419, a light source 2417, and a controller 2415. The controller 2415 may store driving information of the light source 2417. Circuit wirings for operating the light source 2417 are formed on the printed circuit board 2419. In addition, components for operating the light source 2417 may be included. The light source 2417 may include at least one of the light emitting devices 100, 100a, and 100b described with reference to FIGS. 4A to 4C.

The first and second sockets 2405 and 2423 are a pair of sockets and have a structure coupled to both ends of the cylindrical cover unit including the heat dissipation member 2401 and the cover 2427. For example, the first socket 2405 may include an electrode terminal 2403 and a power supply 2407, and a dummy terminal 2425 may be disposed in the second socket 2423. In addition, an optical sensor and/or a communication module may be embedded in any one of the first socket 2405 and the second socket 2423.

Figure 14:
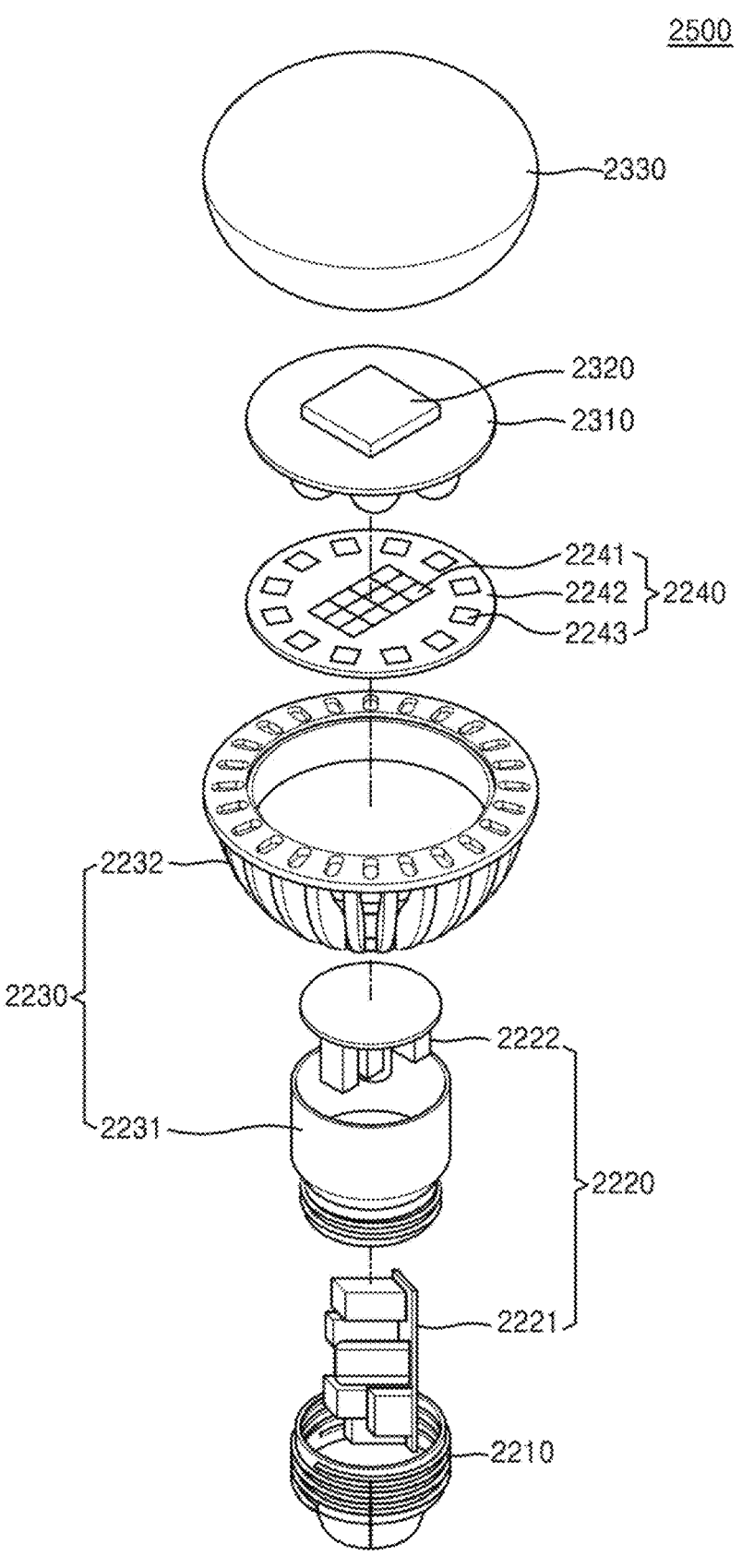
FIG. 14 is an exploded perspective view schematically illustrating a lighting device according to an embodiment.

FIG. 14 is an exploded perspective view schematically illustrating a lighting device 2500 according to an embodiment.

Referring to FIG. 14, in detail, the difference between the lighting device 2500 according to the present embodiment and the lighting device 2200 of FIG. 12 is that a reflector 2310 and a communication module 2320 are included in the upper portion of the light source module 2240. The reflector 2310 may reduce glare by evenly spreading the light from the light source to the side and rear.

A communication module 2320 may be mounted on the reflector 2310, and home-network communication may be implemented through the communication module 2320. For example, the communication module 2320 may be a wireless communication module using Zigbee, Wi-Fi, or LiFi, and may control lighting installed inside and outside the home, such as on/off, brightness control, etc. of a lighting device or control electronic products and automobile systems inside and outside the home, such as TV, refrigerator, air conditioner, door lock, and automobile, through a smart phone or a wireless controller. The reflector 2310 and the communication module 2320 may be covered by a cover portion 2330.

Figure 15:
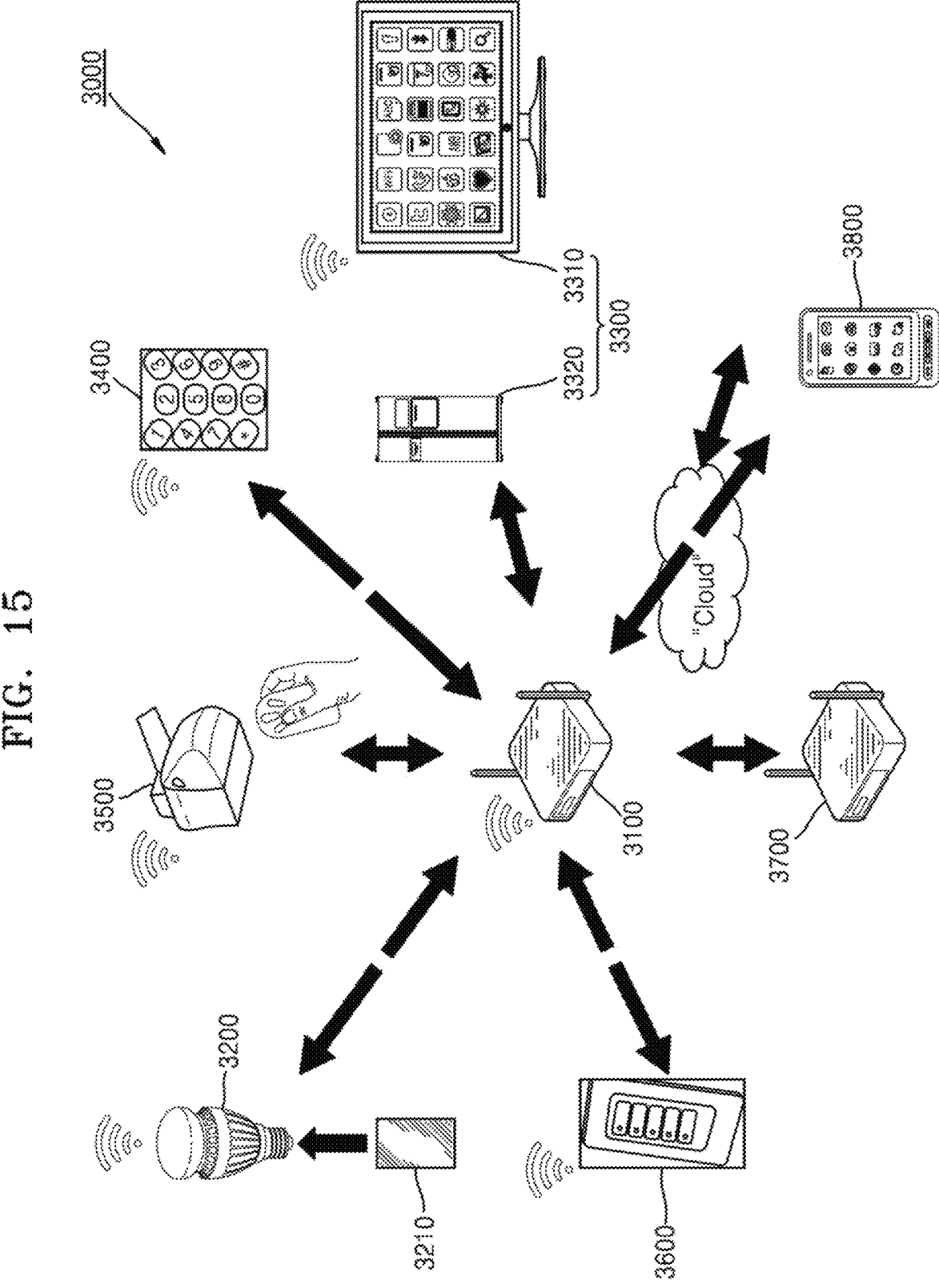
FIG. 15 is a schematic diagram for explaining an indoor lighting control network system according to an embodiment.

FIG. 15 is a schematic diagram for explaining an indoor lighting control network system 3000 according to an embodiment.

Referring to FIG. 15, in detail, the network system 3000 may be a complex smart lighting-network system in which lighting technology using light emitting devices such as LEDs, Internet of Things (IoT) technology, and wireless communication technology, and the like are combined. The network system 3000 may be implemented using various lighting devices and wired/wireless communication devices, or may be implemented based on the Internet of Things environment to collect/process various information and provide the collected/processed information to the user.

The LED lamp 3200 included in the network system 3000 may not only receive information on the surrounding environment from the gateway 3100 to control the lighting of the LED lamp 3200 itself, but also perform a role such as checking and controlling the operation state of other devices 3300 to 3800 included in the IoT environment based on a function of the LED lamp 3200 such as visible light communication. The LED lamp 3200 may include at least one of the light emitting devices 100, 100a, and 100b described with reference to FIGS. 4A to 4C described above. The LED lamp 3200 may be connected to communicate with the gateway 3100 by a wireless communication protocol such as WiFi, Zigbee, and LiFi, and may have at least one communication module 3210 for the lamp for this purpose.

When the network system 3000 is applied to the home, the plurality of devices 3300 to 3800 may include a home appliance 3300, a digital door lock 3400, a garage door lock 3500, a switch 3600 for lighting installed on a wall, etc., router 3700 for wireless communication network relay, and a mobile device 3800 such as a smart phone, a tablet, or a laptop computer.

In the network system 3000, the LED lamp 3200 may check the operating states of various devices 3300 to 3800 using a wireless communication network (Zigbee, WiFi, LiFi, etc.) installed in the home, or may automatically adjust the illuminance of the LED lamp 3200 itself depending on the surrounding environment/situation. In addition, the LED lamp 3200 may control the devices 3300 to 3800 included in the network system 3000 using LiFi communication using visible light emitted from the LED lamp 3200.

First, the LED lamp 3200 may automatically adjust the illuminance of the LED lamp 3200 based on the surrounding environment information transmitted from the gateway 3100 through the lamp communication module 3210 or the surrounding environment information collected from a sensor mounted on the LED lamp 3200. For example, the lighting brightness of the LED lamp 3200 may be automatically adjusted depending on the type of a program being broadcast on the television 3310 or the brightness of the screen. To do this, the LED lamp 3200 may receive operation information of the television 3310 from the lamp communication module 3210 connected to the gateway 3100. The lamp communication module 3210 may be modularized integrally with a sensor and/or a controller included in the LED lamp 3200.

For example, when a certain amount of time has elapsed after the digital door lock 3400 is locked in a state where there is no person in the home, it is possible to prevent wastage of electricity by turning off all the turned-on LED lamps 3200. Alternatively, in a case where the security mode is set through the mobile device 3800 or the like, when the digital door lock 3400 is locked in a state where there is no person in the home, the LED lamp 3200 may be maintained in a turned-on state.

The operation of the LED lamp 3200 may be controlled depending on the surrounding environment collected through various sensors connected to the network system 3000. For example, when the network system 3000 is implemented in a building, the network system combines lighting, location sensors, and communication modules within a building and collects location information of people in the building to turn on or turn off lighting or provide the collected information in real time, thereby enabling efficient facility management or efficient utilization idle space.

Figure 16:
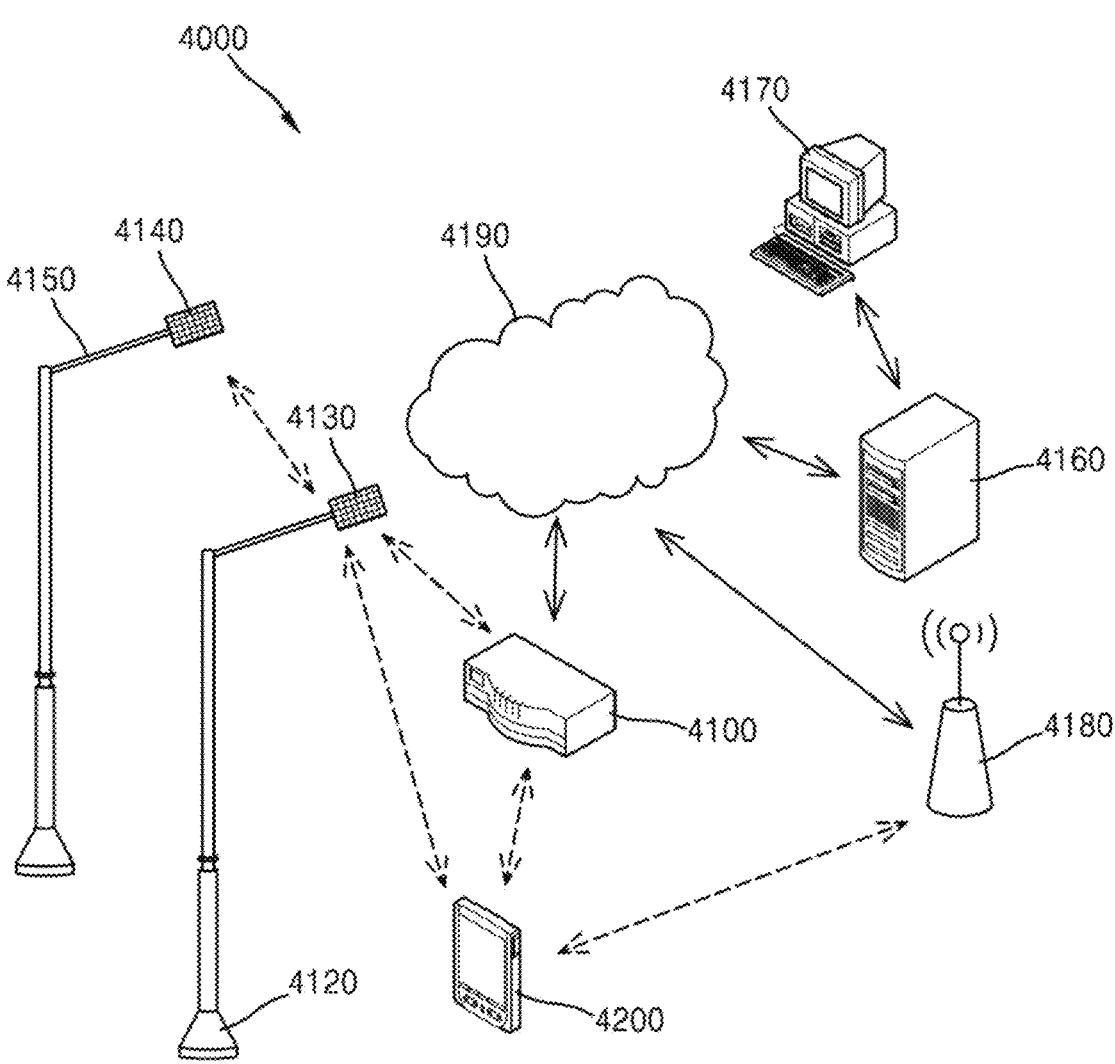
FIG. 16 is a schematic diagram illustrating a network system according to an embodiment.

FIG. 16 is a schematic diagram illustrating a network system 4000 according to an embodiment.

Referring to FIG. 16, in detail, FIG. 16 shows an embodiment of a network system 4000 applied to an open space. The network system 4000 may include a communication connection device 4100, a plurality of lighting devices 4120 and 4150 installed at predetermined intervals and connected to be communicable with the communication connection device 4100, a server 4160, a computer 4170 for managing the server 4160, communication base station 4180, a communication network 4190 for connecting devices capable of communication, a mobile device 4200, and the like.

Each of the plurality of lighting devices 4120 and 4150 installed in an open external space, such as a street or a park, may include a smart engine 4130 and 4140. The smart engines 4130 and 4140 may include a light emitting device for emitting light, a driving driver for driving the light emitting device, a sensor for collecting information about the surrounding environment, and a communication module. The light emitting device included in the smart engine may include at least one of the light emitting devices 100, 100a, and 100b described with reference to FIGS. 4A to 4C.

By the communication module, the smart engines 4130 and 4140 may communicate with other peripheral devices based on a communication protocol such as WiFi, Zigbee, or LiFi. One smart engine 4130 may be connected to communicate with another smart engine 4140, and a WiFi extension technology (WiFi Mesh) may be applied to communication between the smart engines 4130 and 4140. At least one smart engine 4130 may be connected to the communication connection device 4100 connected to the communication network 4190 through wired/wireless communication.

The communication connection device 4100 is an access point (AP) capable of wired/wireless communication and may mediate communication between the communication network 4190 and other equipment. The communication connection device 4100 may be connected to the communication network 4190 by at least one of a wired/wireless method, and for example, and may be mechanically accommodated in any one of the lighting devices 4120 and 4150.

The communication connection device 4100 may be connected to the mobile device 4200 through a communication protocol such as WiFi. The user of the mobile device 4200 may receive the surrounding environment information collected by the plurality of smart engines 4130 and 4140, for example, surrounding traffic information, weather information, and the like through the communication connection device 4100 connected to the smart engine 4130 of the adjacent lighting device 4120. The mobile device 4200 may be connected to the communication network 4190 using a wireless cellular communication method such as 3G or 4G through the communication base station 4180.

On the other hand, the server 4160 connected to the communication network 4190 may receive information collected by the smart engines 4130 and 4140 mounted on each of the lighting devices 4120 and 4150 and monitor the operating state of each lighting device 4120 and 4150, etc. The server 4160 may be connected to a computer 4170 that provides a management system, and the computer 4170 may execute software capable of monitoring and managing the operating states of the smart engines 4130 and 4140.

Figure 17:
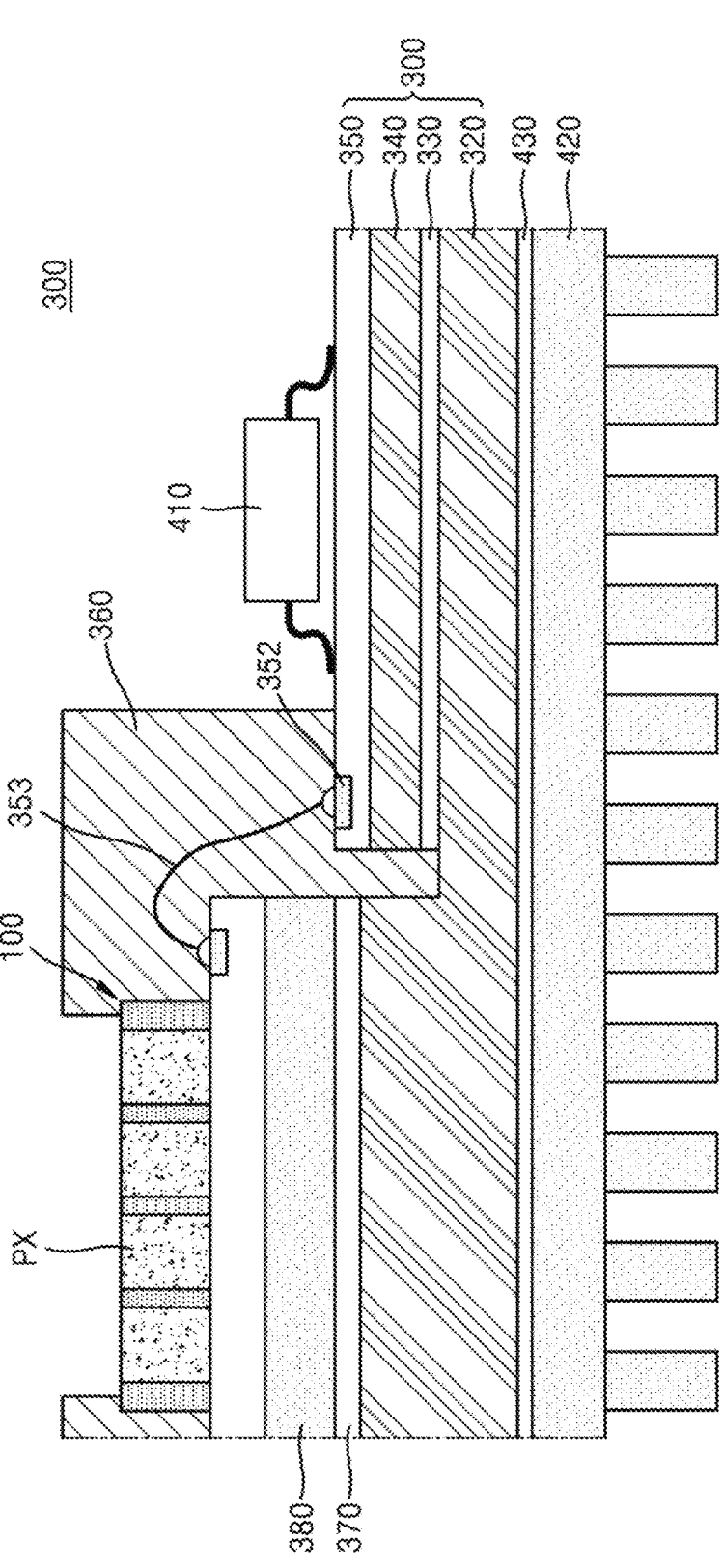
FIG. 17 is a cross-sectional view illustrating a light emitting package according to an embodiment.

FIG. 17 is a cross-sectional view illustrating a light emitting package 300 according to an embodiment.

Referring to FIG. 17, the light emitting package 300 may include a light emitting device 100 and a driving semiconductor chip 410 mounted on a package substrate 310.

A lower insulating layer 330, an internal conductive pattern layer 340, and an upper insulating layer 350 are sequentially stacked on a partial region of the base plate 320, and one or more driving semiconductor chips 410 may be mounted on a conductive pattern disposed on the upper insulating layer 350.

An interposer 380 may be disposed on another region of the base plate 320 with an adhesive layer 370 interposed therebetween, and the light emitting device 100 may be mounted on the interposer 380. In example embodiments, the interposer 380 may be the same as the support substrate 154 (FIG. 4A) included in the light emitting device 100, but is not limited thereto. One or more driving semiconductor chips 410 may be electrically connected to the semiconductor light emitting device 100 through a bonding wire 353 connected to the pad 352. The one or more driving semiconductor chips 410 may be configured to individually or entirely drive the plurality of pixels PX of the semiconductor light emitting device 100.

The bonding wire 353 may be encapsulated by the molding resin 360. The molding resin 360 may be, for example, an epoxy molding compound (EMC), and is not particularly limited. The molding resin 360 may partially encapsulate the light emitting device 100 so that light emitted from the plurality of pixels PX of the light emitting device 100 is not blocked.

A heat sink 420 is attached to the bottom surface of the base plate 320, and optionally, a TIM layer 430 may be further interposed between the heat sink 420 and the base plate 320.

In the light emitting package 300, the light emitting devices 100, 100a and 100b described with reference to FIGS. 4A to 4C, and/or the light source module 1000 described with reference to FIGS. 8 and 9 may be mounted alone or in combination.

While aspects of example embodiments have been particularly shown and described, it will be understood that various changes in form and details may be made therein without departing from the spirit and scope of the following claims.

What is claimed is:

1. A light emitting device comprising:
a first semiconductor layer;
a dislocation blocking layer, on the first semiconductor layer and having a plurality of holes formed therein;
a second semiconductor layer on the dislocation blocking layer;
a third semiconductor layer on the second semiconductor layer;
an active layer on the third semiconductor layer; and
a fourth semiconductor layer on the active layer,
wherein a plurality of voids, which respectively overlap the plurality of holes in a planar view, are provided between the first semiconductor layer and the second semiconductor layer,
wherein the plurality of holes comprises a first hole and the plurality of voids comprises a first void which overlaps the first hole in the planar view,
wherein a distance between an upper surface of the first void and a lower surface of the first semiconductor layer is less than a thickness of the first semiconductor layer, and
wherein the second semiconductor layer extends through the first hole to the upper surface of the first void.

2. The light emitting device of claim 1, wherein the plurality of voids block dislocations.

3. The light emitting device of claim 1, wherein the plurality of holes are at least partially filled by the second semiconductor layer.

4. The light emitting device of claim 1, wherein the plurality of voids further comprises a second void, and wherein an upper surface of the second void and the upper surface of the first void are at different levels along a vertical direction.

5. The light emitting device of claim 1, wherein the plurality of voids further comprises a second void, and
wherein a lower end of the first void and a lower end of the second void are at a common level along a vertical direction.

6. The light emitting device of claim 1, wherein, in the planar view, a distance between the plurality of voids is not constant.

7. The light emitting device of claim 1, wherein a cross-section of each of the plurality of voids is an inverted triangle.

8. The light emitting device of claim 1, wherein a maximum dimension of each of the plurality of voids in the planar view is about 10 nm to about 500 nm.

9. The light emitting device of claim 1, wherein a dimension in a vertical direction of each of the plurality of voids is about 10 nm to about 500 nm.

10. The light emitting device of claim 1, wherein, in the planar view, a density of the plurality of voids is about $10^3/cm^2$ to about $10^{10}/cm^2$.

11. A light emitting device comprising:
a barrier rib structure having an opening formed therein; and
a light emitting structure on the barrier rib structure,
wherein the light emitting structure comprises a first semiconductor layer, a dislocation blocking layer, a second semiconductor layer, a third semiconductor layer, an active layer, and a fourth semiconductor layer sequentially stacked along a vertical direction on the barrier rib structure,
wherein a plurality of recesses are formed in the first semiconductor layer, and
wherein at least one void is located within at least one of the plurality of recesses,
wherein the plurality of recesses comprises a first recess and the at least one void comprises a first void,
wherein a distance between an upper surface of the first void and a lower surface of the first semiconductor layer is less than a thickness of the first semiconductor layer, and
wherein the second semiconductor layer extends into the first recess to the upper surface of the first void.

12. The light emitting device of claim 11, wherein the second semiconductor layer only partially fills the at least one of the plurality of recesses.

13. The light emitting device of claim 11, wherein the second semiconductor layer entirely fills another one of the plurality of recesses.

14. The light emitting device of claim 11, wherein a plurality of holes respectively overlapping the plurality of recesses along the vertical direction are formed in the dislocation blocking layer, and
wherein a maximum dimension of the plurality of holes in a planar view is about 10 nm to about 500 nm.

15. The light emitting device of claim 11, wherein a thickness of the dislocation blocking layer along the vertical direction is about 1.5 μm to about 3.5 μm.

16. The light emitting device of claim 11, wherein a plurality of holes respectively overlapping the plurality of recesses along the vertical direction are formed in the dislocation blocking layer, and
wherein a density of the plurality of holes in a planar view is about $10^3/cm^2$ to about $10^{10}/cm^2$.

17. The light emitting device of claim 11, wherein a plurality of holes respectively overlapping the plurality of recesses along the vertical direction are formed in the dislocation blocking layer, and wherein a density of the at least one void is less than a density of the plurality of holes in a planar view.

18. The light emitting device of claim 11, wherein, a cross-section of each of the plurality of recesses is an inverted triangle.

19. A light emitting device comprising:

a silicon barrier rib structure having an opening formed therein; and a light emitting structure on the silicon barrier rib structure, wherein the light emitting structure comprises a first semiconductor layer, a silicon nitride layer, a second semiconductor layer, a third semiconductor layer, an active layer, and a fourth semiconductor layer sequentially stacked on the silicon barrier rib structure, wherein a plurality of recesses are formed in the first semiconductor layer, and wherein at least one void is located in at least one of the plurality of recesses, and wherein the at least one of the plurality of recesses comprises a first recess, and the at least one void comprises a first void, wherein a distance between an upper surface of the first void and a lower surface of the first semiconductor layer is less than a thickness of the first semiconductor layer, and wherein the second semiconductor layer extends into the first recess to the upper surface of the at least one void.

* * * * *